United States Patent
Yagi

(10) Patent No.: US 6,362,494 B1
(45) Date of Patent: Mar. 26, 2002

(54) SEMICONDUCTOR DEVICE AND METHOD AND APPARATUS FOR MANUFACTURING SEMICONDUCTOR DEVICE

(75) Inventor: Shigeru Yagi, Minami-Ashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/294,403

(22) Filed: Apr. 20, 1999

(30) Foreign Application Priority Data

Apr. 24, 1998 (JP) .......................................... 10-115265
Nov. 27, 1998 (JP) .......................................... 10-338149

(51) Int. Cl.$^7$ ............................................. H01L 33/00
(52) U.S. Cl. ..................... 257/76; 257/103; 257/615
(58) Field of Search ................... 257/76, 79, 103, 257/613, 615

(56) References Cited

U.S. PATENT DOCUMENTS 3,849,707 A * 11/1974 Braslau et al. ................. 357/17
5,976,398 A * 11/1999 Yagi ............................ 252/62.3

FOREIGN PATENT DOCUMENTS

| JP | 1-155630 | * | 6/1989 | ............... 438/778 |
| JP | 10-79348 | * | 3/1998 | |
| JP | 10-81504 | * | 3/1998 | |

OTHER PUBLICATIONS

Takashi Tokuda et al., Growth of GaN by Plasma–Assisted OMVPE, Department of electronic science and engineering, Koyoto University, Nov. 1995, pp. 25–30.
A. Yoshida, Fabrication and characterization of InN and InAlN crystalline thin films by microwave–excited metalorganic vapor phase epitaxy, 1993 pp.1–6.
J.M. Van Hove, et al, GaN growht by controllable RF–excited nitrogen source, Jornal of Crystal Growth 150 (1995) pp. 908–911.
Sakae Zembutsu et al., Growth of GaN single crystal films using electron cyclotron resonance plasma excited metalorganic vapor phase epitaxy, Appl. Phys. Lett. 48 (13), Mar. 31, 1986 pp. 870–872.
Kouvetakis et al., "Chemical Vapor Deposition of Gallium Nitride from Diethylgallium Azide," Chemistry of Materials, vol. 1, No. 4, 1989, pp. 476–478.*
Knights et al., "Plasma deposition of GaP and GaN," J. Appl. Phys., vol. 49, No. 3, Mar. 1978, pp. 1291–1293.*

* cited by examiner

Primary Examiner—Eddie Lee
Assistant Examiner—Bradley WM. Baumeister
(74) Attorney, Agent, or Firm—Oliff & Berridge, PLC

(57) ABSTRACT

Provided is a method and apparatus for the production of a semiconductor device, the method and the apparatus producing a high quality and highly functional semiconductor device efficiently at low temperatures in a short time and also a high quality and highly functional semiconductor device produced by the method and apparatus. The semiconductor device is produced by forming a film of a nitride compound on a substrate having heat resistance at 600° C. or less, wherein the nitride compound includes one or more elements selected from group IIIA elements of the periodic table and a nitrogen atom and produces photoluminescence at the band edges at room temperature. The method for producing a semiconductor device comprises introducing an organic metal compound containing one or more elements selected from group IIIA elements of the periodic table intermittently in an activated environment, while continuously activating a nitrogen compound, to form a film of a nitride compound containing nitrogen and the group IIIA elements on a substrate.

3 Claims, 17 Drawing Sheets

INFRARED ABSORPTION SPECTRUM

INFRARED ABSORPTION SPECTRUM

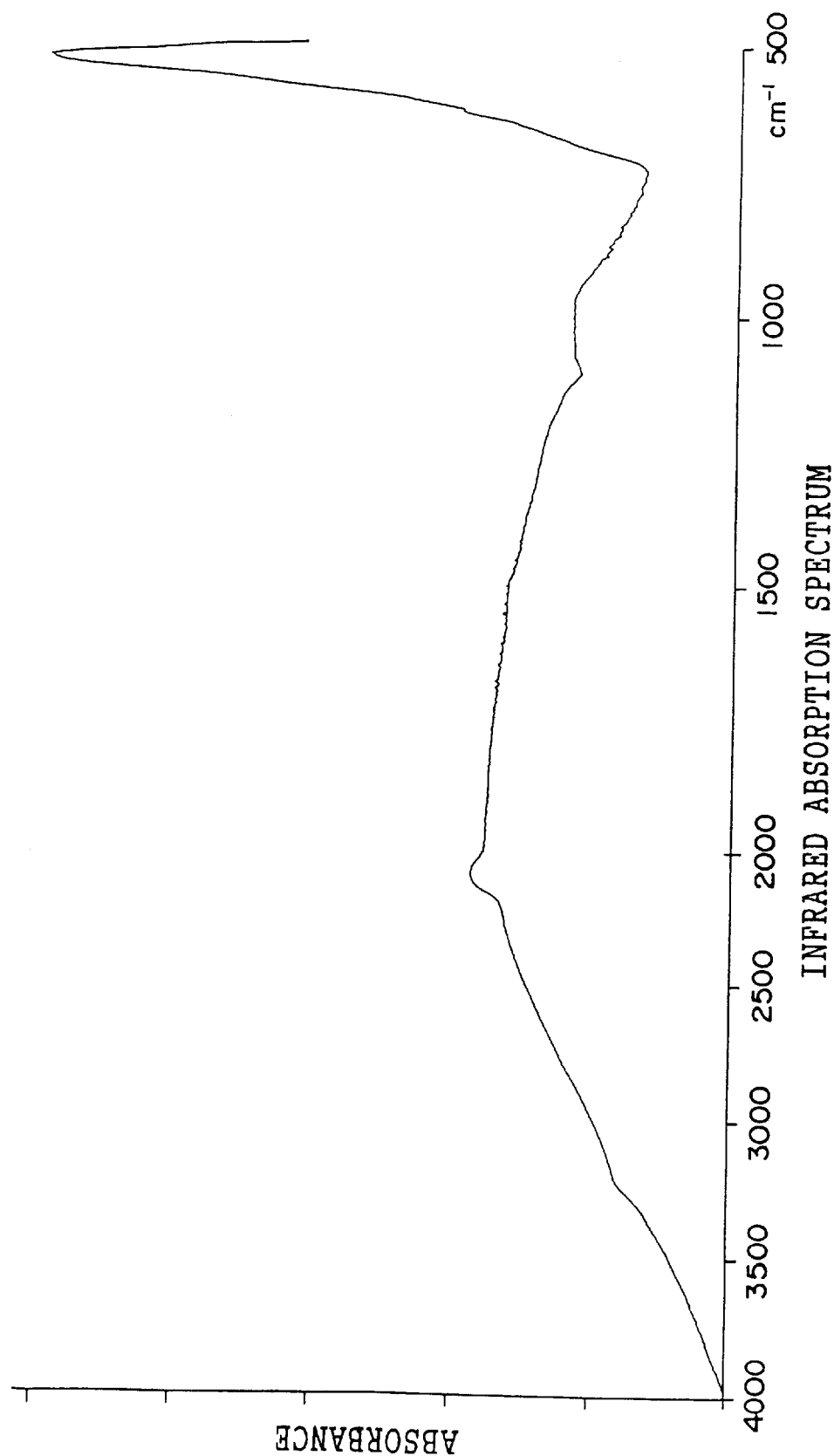

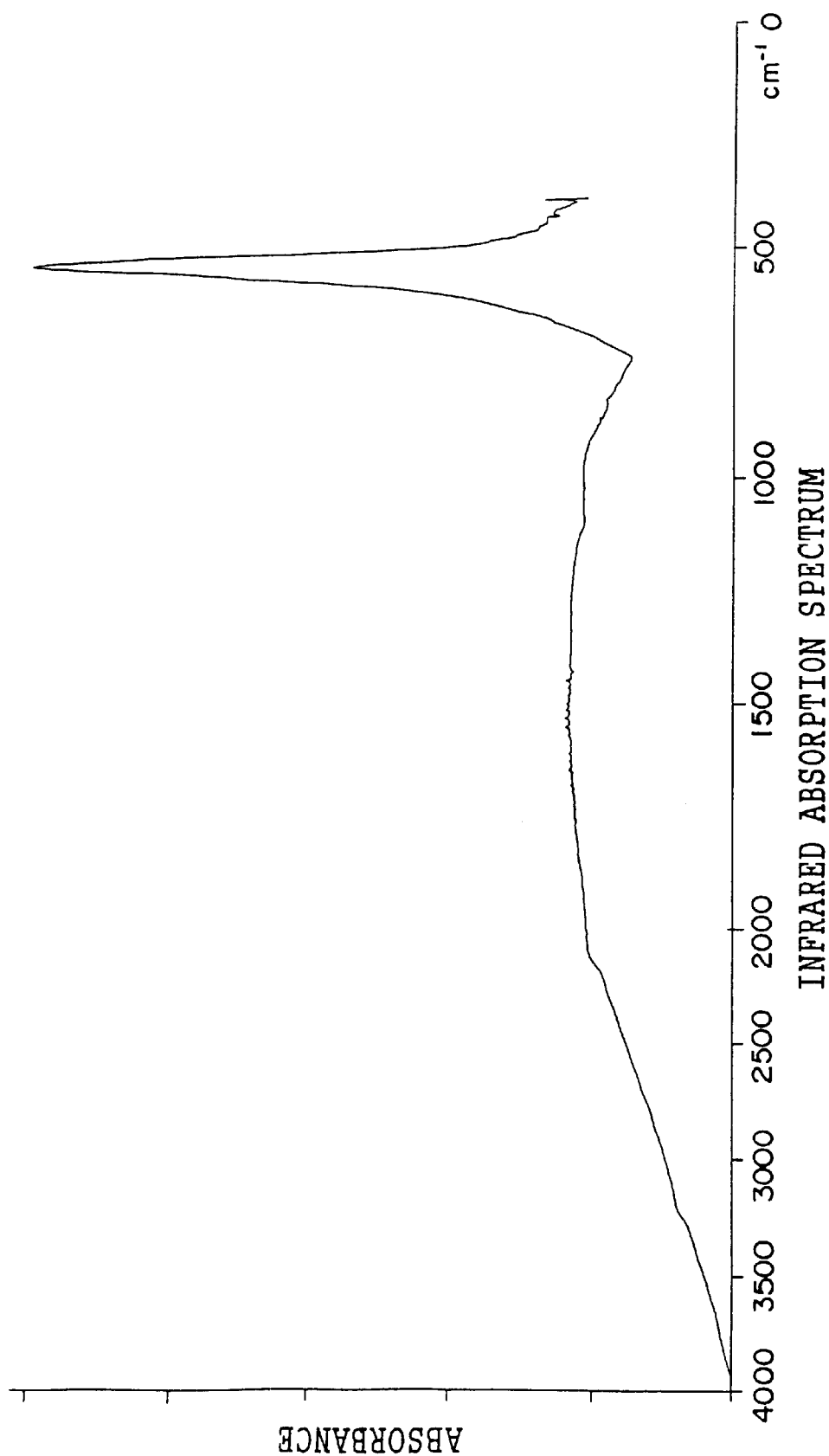

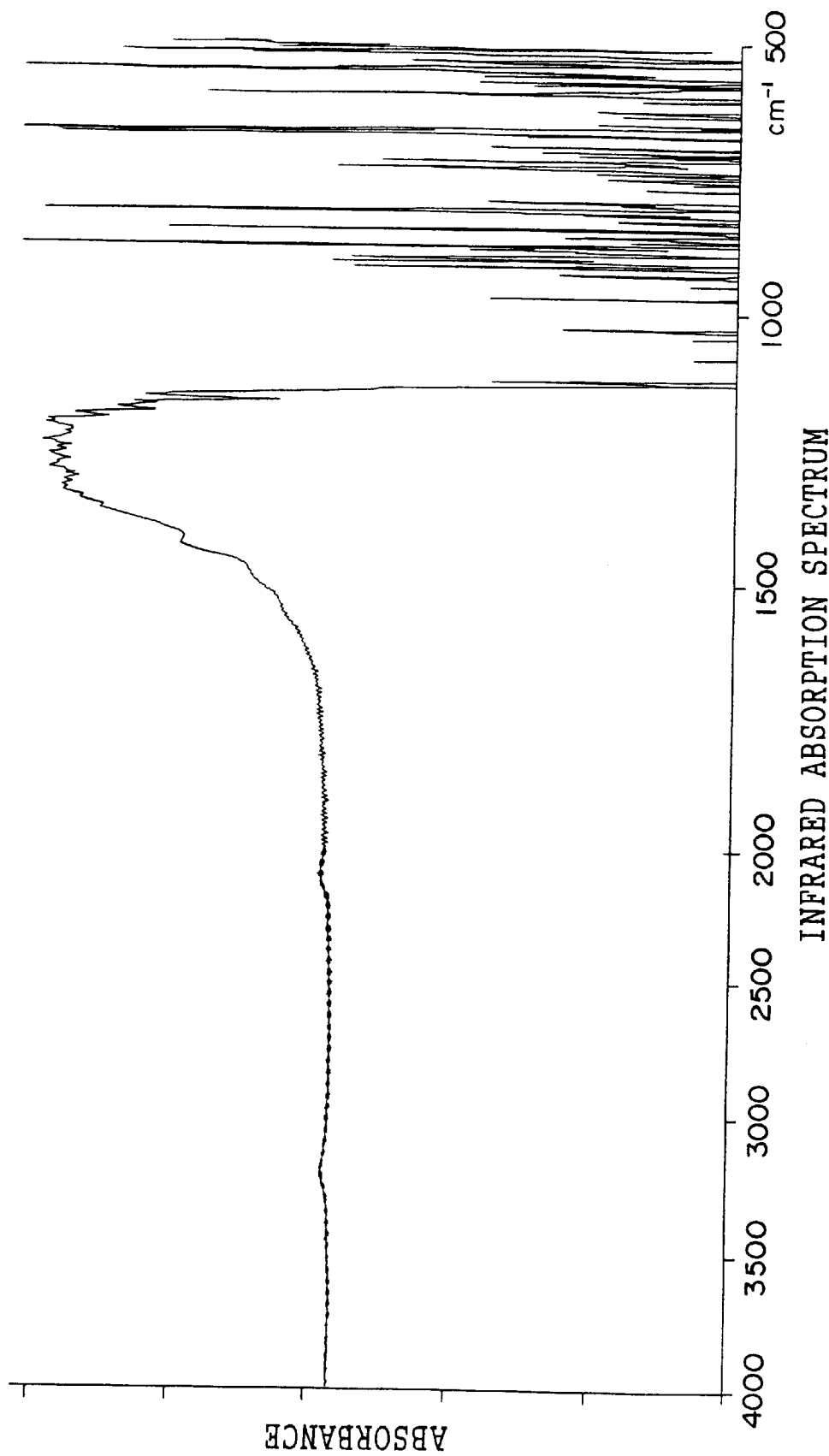

SEMICONDUCTOR DEVICE AND METHOD AND APPARATUS FOR MANUFACTURING SEMICONDUCTOR DEVICE

BACKGROUND OF THE INVENTION

1. Field of the Invention

The present invention relates to a semiconductor device and a method and apparatus for manufacturing a semiconductor device, and, particularly, to a nitride compound semiconductor device and a method and apparatus for manufacturing the nitride compound semiconductor device.

2. Description of the Related Art

In recent years, semiconductor compounds having a large bandgap, such as AlN, GaN, AlGaN, GaInN and InN, have attracted considerable attention as materials such applications as blue LEDs, blue LDs and visible light-emitting elements. In the production of these nitride-type group IIIA (Group number 13 in a revised edition of Inorganic Chemistry Nomenclature in 1989 by IUPAC (International Union of Pure and Applied Chemistry))-VA (Group number 15 in a revised edition of Inorganic Chemistry Nomenclature in 1989 by IUPAC) semiconductor compounds, $NH_3$ gas or $N_2$ gas is used as the VA element source. These $NH_3$ gas and $N_2$ gas are however more stable and hence more inactive than the VA element sources, e.g., $AsH_3$ gas and $PH_3$ gas which are used in the production of other III–V compound semiconductors. When a film of the nitride-type III–V semiconductor compound is formed on a substrate by a metal organic chemical vapor deposition method (MOCVD), the temperature of the substrate is therefore adjusted to 900 to 1200° C.

The materials which can be used at this substrate temperature are, however, limited. Bulk crystal substrates which are usually used for III–V compound semiconductors, e.g., GaAs, cannot be used but expensive substrate materials such as sapphire and SiC crystal are used. However, almost no In is incorporated into crystals at substrate temperatures as high as 900 to 1200° C. at which GaN of high quality grows and hence the substrate temperature is lowered in the production of mixed crystals containing In. In this method, however, the film quality of a compound semiconductor is sacrificed and it is therefore difficult to obtain a high quality mixed crystal containing 10% or more of In. Also, the method of changing the substrate temperature, when a film is formed at high temperatures, may cause, for instance, the diffusion of elements in the film formed at low temperatures and it is therefore difficult in practice to produce multi-layer film or super lattice elements.

To make growth at low temperatures, there is a method in which $NH_3$ gas or $N_2$ gas used as a VA element source is made into the form of plasma by glow discharge (J. M. Van Hore et al., J. Cryst. Growth 150 (1995) 908), microwave discharge, or electron cyclotron resonance and an organic metal compound containing a IIIA element is introduced into the remote plasma to form a film (A. Yoshida, New Functionality materials, Vol. C. 183–188 (1993), S. Zembutsu et al., App. Phys. Lett. 48, 870). It is reported that the formation of a GaN film using this method at temperatures between 600 and 900° C. results in the production of crystals exhibiting a strong UV photoluminescence when the film is formed at 900° C. (Tokuda, Wakahara, Sasaki, Shingaku Technical Report ED, 95–120p 25 (1995–11).

Well-known apparatuses for the production of a semiconductor device using this type of remote plasma include those comprising one activating means connected to a reactor, a first supply means for supplying the element source of the group VA, e.g., $N_2$ gas to the activating means from the side opposite to the reactor and a second supply means for supplying an organic metal compound containing a IIIA element to the reactor side of the activating means.

It is, however, reported that, in the crystals grown at temperatures as low as 600° C. or less using such an apparatus for the production of semiconductor devices, the crystallinity is reduced and hence only peaks from a deep level are observed. An increase in the amount of the raw materials to improve the growth rate results in the inclusion of a large amount of hydrogen in the film bringing about a further reduction in the crystallinity. Moreover, when a mixed crystal is produced using this apparatus for production of semiconductor device, a mixed gas containing two or more organic metal compounds, for example, trimethylgallium and trimethylindium is supplied by the second supply means. However, since the binding energies of these organic metal compounds differ from each other, one of either of these metal compounds tends to be selectively decomposed when these compounds are introduced into the plasma, giving rise to the problems that, even if the ratio of the two compounds in the mixed gas is regulated, the composition of the resulting film is controlled with difficulty, the crystallinity of the mixed crystal film is reduced and carbon impurities derived from the more undecomposable organic metal compound get mixed in the resulting film.

The cause of these problems is considered to be in the fact that, at such low temperature conditions that the raw material of the organic metal compound containing the IIIA element which takes a three-coordinate form in a gaseous state has difficulty in decomposing, releasing, and rearranging on the growth surface, the IIIA element either remains on the growth surface in the three-coordinate state while it contains hydrogen or is left as an element having a binding defect in the film as it has difficulty forming a four-coordinate network with a nitrogen atom.

An object of the present invention is to improve these drawbacks of the conventional method and apparatus using this type of a remote plasma for the production of a semiconductor device and to provide a method and apparatus for producing a semiconductor device having high quality and performance at a low temperature efficiently and also to provide a semiconductor device produced using these method and apparatus.

SUMMARY OF THE INVENTION

The inventors of the present invention have made earnest efforts and, as a result, have found that it is possible to produce a microcrystal film and crystal film having high quality by controlling a film forming step and reaction step using plasma and repeating a step of the formation of a IIIA element/nitrogen layer from an activated IIIA element atom and an activated nitrogen atom, and a step subsequent to this type of growth of a nitrogen layer containing nitrogen or nitrogen and hydrogen, a step of the passivation of defects and a step of the extraction of hydrogen, thereby solving the above problem, to complete the present invention. The present invention is characterized in that crystal growth is forwarded while the growth surface of a binding layer formed of a IIIA element atom and a nitrogen atom is restored and grown by the aid of a nitrogen atom and a hydrogen atom.

Accordingly, the features of the present invention to solve the aforementioned problem reside in:

<1> A semiconductor device produced by forming a film of a nitride compound on a substrate having heat resistance at 600° C. or less, wherein the nitride compound includes one or more elements selected from group IIIA elements of the periodic table and a nitrogen atom and produces photoluminescence at the band edges at room temperature;

<2> A semiconductor device according to <1>, wherein the substrate is constituted of a base material selected from the group consisting of an electroconductive material, a semiconductor material and an insulating material;

<3> A semiconductor device according to <1>, wherein the substrate is transparent;

<4> A semiconductor device according to <2>, wherein the substrate is transparent;

<5> A semiconductor device produced by forming a film of a nitride compound on a substrate having heat resistance at 600° C. or less, the nitride compound including one or more elements selected from group IIIA elements of the periodic table and a nitrogen atom, wherein the absorption wavelength for the nitride compound in an infrared absorption spectrum ranges between 3000 cm$^{-1}$ and 700 cm$^{-1}$;

<6> A semiconductor device according to <5>, wherein the absorption wavelength for the nitride compound in an infrared absorption spectrum further ranges between 700 cm$^{-1}$ and 400 cm$^{-1}$ and the ratio (Ia/Ib) of the maximum absorbance (Ia) in a wavelength range between 3000 cm$^{-1}$ and 700 cm$^{-1}$ to the maximum absorbance (Ib) in a wavelength range between 700 cm$^{-1}$ and 400 cm$^{-1}$ is 0.01 or more;

<7> A semiconductor device according to <5>, wherein the substrate is opaque and the semiconductor device is used as a photovoltaic element;

<8> A semiconductor device according to <1>, wherein the nitride compound is a mixed crystal of two or more semiconductor compounds;

<9> A method for producing a semiconductor device, the method comprising continuously activating a nitrogen compound while introducing an organic metal compound containing one or more elements selected from group IIIA elements of the periodic table intermittently in the activated environment, to form a film of a nitride compound containing nitrogen and the group IIIA elements on a substrate;

<10> A method for producing a semiconductor device according to <9>, wherein hydrogen or a compound containing hydrogen is further added to the activated environment;

<11> A method for producing a semiconductor device according to <9>, wherein the organic metal compound comprises two or more organic metal compounds containing different group IIIA elements and the nitride compound is a mixed crystal of two or more semiconductor compounds;

<12> A method for producing a semiconductor device according to <11>, wherein the two or more organic metal compounds are introduced intermittently at the same time;

<13> A method for producing a semiconductor device according to <11>, wherein the two or more organic metal compounds are introduced intermittently so as not to overlap each other in time;

<14> A method for producing a semiconductor device according to <9>, wherein a raw material for pn control is further added to the activated environment;

<15> A method for producing a semiconductor device according to <9>, wherein glow discharge using radio frequency and/or glow discharge using microwave for the activation of the nitride compound;

<16> A method for producing a semiconductor device according to any one of <9> to <15>, wherein the temperature at which the film is formed on the substrate is 600° C. or less;

<17> A method for producing a semiconductor device, the method comprising continuously activating a nitrogen compound, continuously and separately activating an assistant material which is different from the nitrogen compound simultaneously and introducing an organic metal compound containing one or more elements selected from group IIIA elements of the periodic table intermittently in the environment in which the assistant material is activated, to form a film of a nitride compound containing nitrogen and the group IIIA elements on a substrate;

<18> An apparatus for producing a semiconductor device comprising a reactor for forming a film of a nitride compound on a substrate; a heating and supporting means provided in the reactor for supporting and heating the substrate; a first supply means for supplying a first raw gas; a first activating means for activating the supplied first raw gas, the first activating means being connected to the first supply means and the reactor; and a second supply means for supplying a second raw gas intermittently to the reactor;

<19> An apparatus for producing a semiconductor device according to <18>, further comprising a third supply means for supplying a third gas and a second activating means for activating the supplied third gas, the second activating means being connected to the reactor and the third supply means; and <20> An apparatus for producing a semiconductor device according to <19>, further comprising a fourth supply means for supplying a fourth raw gas to the reactor side of the second activating means, wherein the second supply means connects to the reactor side of the first activating means.

BRIEF DESCRIPTION OF THE DRAWINGS

FIGS. 4-1 to 4-7 are views explaining a method for introducing an organic metal compound containing a IIIA element.

FIG. 5 is a graph showing an XRD spectrum of a film on a sapphire substrate after the film is formed in example 1.

FIG. 6 is a graph showing an XRD spectrum of a film on a Si substrate after the film is formed in example 1.

FIG. 7 is a graph showing an infrared absorption spectrum of a film on a Si substrate after the film is formed in example 1.

FIG. 15 is a graph showing an infrared absorption spectrum of a film on a Si substrate after the film is formed in example 9.

FIG. 16 is a graph showing an infrared absorption spectrum of a film on a Si substrate after the film is formed in example 10.

FIG. 17 is a graph showing an infrared absorption spectrum of a film on a sapphire substrate after the film is formed in example 10.

DETAILED DESCRIPTION OF THE PREFERRED EMBODIMENTS

Figure 1:
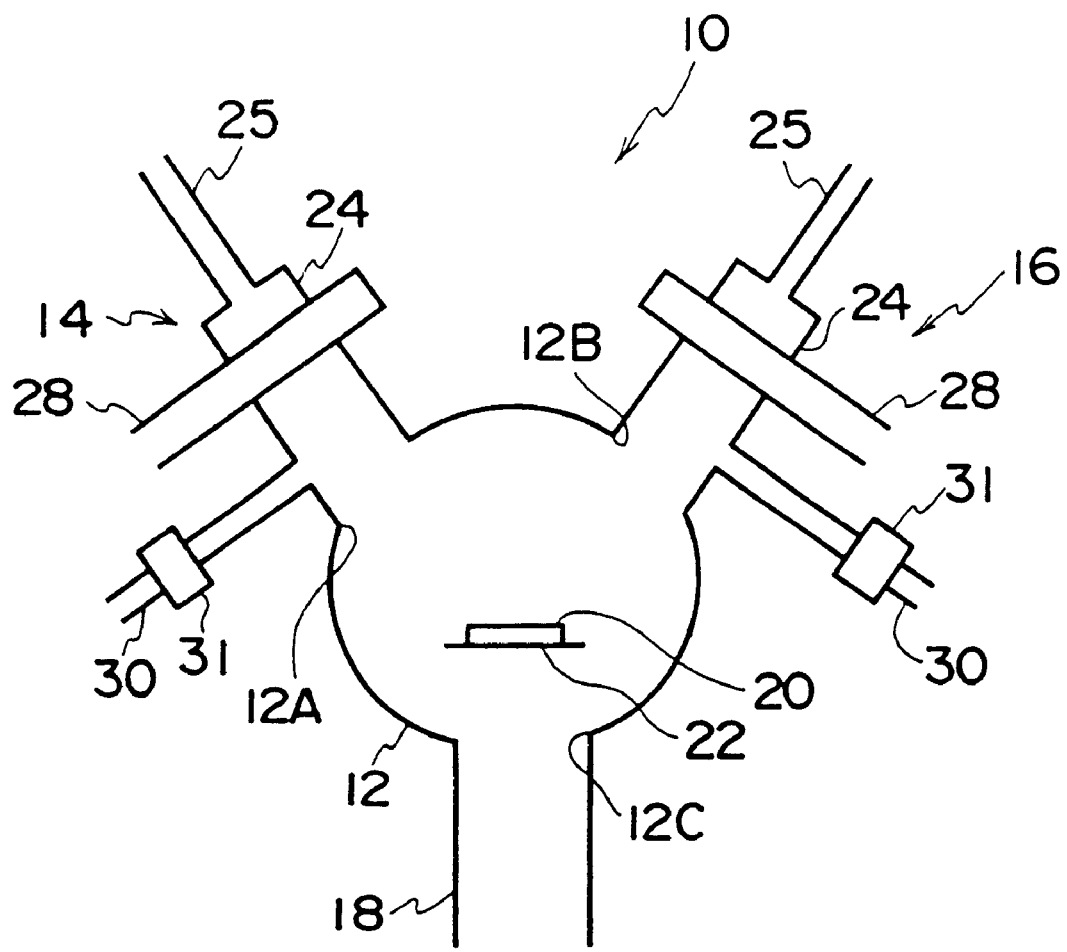
FIG. 1 is a schematic structural view of an apparatus for the manufacturing of a semiconductor device according to a first embodiment of the present invention.

The present invention will be explained in detail.

A first invention of the present application is a semiconductor device produced by forming a film of a nitride compound on a substrate having heat resistance of 600° C. or less, wherein the nitride compound includes one or more elements selected from IIIA elements of the periodic table and a nitrogen atom and produces photoluminescence at the band edges at room temperature.

A second invention of the present application is a semiconductor device produced by forming a film of a nitride compound on a substrate having heat resistance of 600° C. or less, the nitride compound including one or more elements selected from the IIIA elements of the periodic table and a nitrogen atom, wherein the absorption wavelength for the nitride compound in the infrared absorption spectrum ranges between 3000 $cm^{-1}$ and 700 $cm^{-1}$. The infrared absorption spectrum may include a sharp absorption due to the vibrations absorption of the IIIA element atom and nitrogen atom at wavelengths between 700 $cm^{-1}$ and 400 $cm^{-1}$. Preferably the ratio (Ia/Ib) of the maximum absorbance (Ia) in a wavelength range between 3000 $cm^{-1}$ and 700 $cm^{-1}$ to the maximum absorbance (Ib) in a wavelength range between 700 $cm^{-1}$ and 400 $cm^{-1}$ is 0.01 or more. Preferably also the half width of the sharp absorption peak at a wavelength between 700 $cm^{-1}$ and 400 $cm^{-1}$ is 150 $cm^{-1}$ or less. The nitride compound may further include one or more elements selected from the group consisting of C, Si, Ge and Sn. The nitride compound may further include one or more elements selected from the group consisting of Be, Mg, Ca, Zn and Sr. The substrate is preferably made of crystal silicon and/or microcrystal silicon and may contain germanium.

A third invention of the present application is a method for producing a semiconductor device, the method comprising introducing an organic metal compound containing one or more elements selected from IIIA elements of the periodic table intermittently in an activated environment, while continuously activating a nitrogen compound, to form a film of a nitride compound containing nitrogen and the IIIA elements on a substrate.

A fourth invention of this application is a method for producing a semiconductor device, the method comprising a step of continuously activating a nitrogen compound, a simultaneous step of continuously and separately activating an assistant material, and a step of introducing an organic metal compound containing one or more elements selected from IIIA elements of the periodic table intermittently in the environment in which the assistant material is activated, to form a film of a nitride compound containing nitrogen and the IIIA elements on a substrate.

A fifth invention of this application is an apparatus for producing a semiconductor device comprising a reactor for forming a film of a nitride compound on a substrate; a heating and supporting means for supporting and heating the substrate; a first supply means for supplying a first raw gas; a first activating means for activating the supplied first raw gas, the first activating means being formed so as to be connected to the first supply means and the reactor; and a second supply means for supplying a second raw gas intermittently to the reactor.

The first invention of this application will be hereinafter explained in detail.

A III–V compound semiconductor is formed from two or more elements and can form a perfect crystal on condition that an atom of a IIIA element and an atom of a V element are bound in a ratio of 1:1 to build up a four-coordinate bond. When crystal growth is made using gas as the starting material, generally, an organic metallic gas in which an atom of the IIIA element has three bonds is primarily used as the starting material. Also, as the starting material for an atom of the VA element, a raw gas having a three-coordinate bond is frequently used. As a consequence, the bond of each atom must be changed from the three-coordinate bond in a vapor phase to the four-coordinate bond in a solid phase.

In a common MOCVD method, this changing reaction is achieved in a molecular reaction associated with heat decomposition. However, in the growth by a remote plasma method at low temperatures at which the decomposition of a raw gas containing organic compounds can not be expected, the reactivity of a film-forming reaction is high since active groups including atoms, ions and radicals participate in the reaction. This causes the introduction of bond defects due to the three-coordinate bond, the production of bonds between atoms of the IIIA elements and between atoms of the VA elements, and the presence of residual carbon, leading to a deep trap level which can seriously deteriorate the performance of the semiconductor device. Additional bonding of the atoms with hydrogen not only compensates for bond defects but also lead to the production of a stable three-coordinate bond with unnecessary hydrogen with the result of the creation of bond defects. In the process using the remote plasma method, no high-quality film of crystals or microcrystals can be obtained therefore.

The above phenomenon is significant especially in the experiment with respect to photoluminescence even when a sapphire substrate is used. For instance, there is a report in which a film formed at 900° C. from a nitride compound which is proved to be a monocrystal by the X-ray diffraction peak thereof is found to emit light at the band edges whereas a film formed at 800° C. is not found to emit light at the band edges, (Tokuda et al., Shingaku Technical Report ED 95–120p 25 (1995)). In the method of the present embodiment, contrary to this type of method for the production of nitride compounds using the remote plasma method, active components including a compound containing nitrogen and a compound containing a IIIA element are used to form, for instance, a GaN layer on the surface of a substrate. In general, on the surface of the GaN layer, GaN as the primary compound and compounds combined with H such as Ga—H, $GaH_2$, N—H and $NH_2$ as well as N atoms including those having unbound bonds and lone-pair electrons exist. When the growth is continued as it is, these atoms and compounds are confined within crystals causing diverse electronic defects.

In the method of the present embodiment, organic metal compounds containing a IIIA element are introduced intermittently so that, subsequent to the growth of the GaN layer, activated nitrogen atoms, molecules, ions and the like are irradiated onto the surface of the GaN layer to carry out a restoration process for bringing the Ga—N bonding to completion, whereby the growth surface can be kept in a condition in which it is filled with Ga—N bonds. In the present invention, hydrogen or a compound containing hydrogen is used as an assistant material to extract and desorb hydrogen from the surface by activated hydrogen atoms, molecules and ions in addition to the restoring action of nitrogen, whereby the growth surface can be kept in a condition which it is perfectly filled with Ga—N bonds. The repeated growth and restoration performed in this manner makes it possible to grow crystals reduced in defects in the film at low temperatures.

The upper temperature limit when the film of the nitride compound is formed on the substrate is determined in such a manner as to avoid crystal defects, cracks and peeling, caused by a difference in the thermal expansion coefficient between the substrate and the film to be formed. The upper temperature limit is also determined depending on the heat resistance (for example, softening point and crystallizing temperature) of the substrate itself. The use of the method of the present embodiment makes it possible to form a film even on various substrate materials which have hitherto been considered to be difficult to grow crystals. For instance, the thermal expansion coefficient of GaN is $5 \times 10^{-6}$/K and hence some substrate materials cannot be used for various reasons including the difference in the thermal expansion coefficient when a film is formed at temperatures above 600° C. and the temperature is then dropped to room temperature. However, the use of the method of the present embodiment ensures that not only can crystals be grown on these substrates but also high quality crystals can be produced.

Given as examples of the substrate having heat resistance at 600° C. or less are substrates whose melting point or softening point is 600° C. or less, substrates which largely differ in the thermal expansion coefficient from the film of the nitride compound to be formed, substrates having a low recrystallization temperature and substrates from which the structural elements and doping elements are extracted by high-temperature heat treatment.

Specific examples of these substrates include metal materials such as Al, Al alloys, zinc and Sn; glasses, such as soda glass, lead glass, borosilicate glass, and aluminosilicate glass, which have a softening point near or lower than 600° C.; transparent substrates produced by applying to the surface of the substrate an electroconductive film of an oxide such as $TiO_2$, $SnO_2$, ZnO or $InSnO_x$ or a metal such as Au, Pt, Ag, Ni or Cr; and substrates, such as iron ($1.2 \times 10^{-5}$/K), stainless steel ($1.0$–$1.6 \times 10^{-5}$/K), Al ($2.3 \times 10^{-5}$/K), Cu ($1.7 \times 10^{-5}$/K), $SiO_2$ ($1.4 \times 10^{-5}$/K) and $TiO_2$ ($0.7 \times 10^{-5}$/K) which largely differ in the thermal expansion coefficient from the film of the nitride compound. Examples of the substrates also include substrates, such as a Si substrate, which greatly differ in the lattice constant (0.543 nm for Si) and in the thermal expansion coefficient ($2.6 \times 10^{-6}$/K for Si) from the film of the nitride compound and have an adverse effect on the quality of the film due to a combination of stress due to lattice mismatching with thermal stress. Examples of the substrate materials further include Ti, Pt, Ni, Cu, Ag, Au and the like which have a low recrystallization temperature and hence cannot keep their original strength.

Moreover, substrate materials, such as hydrogenated amorphous silicon and microcrystal silicon, from which the structural elements and doping elements are extracted by high-temperature heat treatment may be exemplified.

In the present invention, the heat resisting temperature of the substrate is 600° C. or less and preferably in a range between 100 and 600° C. to allow the substrate to be freely selected. The substrate temperature is optionally altered according to the objective use of the film to be grown. For instance, in the case of growing a film of gallium nitride, when the substrate temperature is in a range between 20 and 100° C., an amorphous material and crystals are mixed in the film, specifically, a film in which hydrogenated amorphous GaN and hydrogenated microcrystal GaN are mixed and when the substrate temperature is above 200° C., hydrogenated microcrystal GaN and an epitaxial crystal film can be formed.

If the material constituting the substrate used in the present invention is electroconductive or semiconductive, the electroconductive or semiconductive material may be used as the substrate as it is. If the material is insulated, the insulated material is subjected to electroconductive treatment whereby it can be used as the substrate. Alternatively, a film of the nitride compound may be formed directly on the insulated material as it is. The substrate used in the present invention may also be a crystal or amorphous material.

Examples of the electroconductive material include metals such as aluminum, stainless steel, nickel and chromium and alloy crystals of these metals.

Examples of the semiconductive material include semiconductors such as Si, GaAs and SiC. In particular, semiconductor crystal materials such as Si, GaAs and SiC are preferable for epitaxial growth. The crystalline plane orientation and crystal type of the substrate may be optionally selected.

Examples of the insulating material include polymer films, glasses, ceramics and monocrystals of, for instance, sapphire. Moreover, a film of the above metal, gold, silver or copper may be formed on the insulating material, for instance, by a vapor deposition method, sputtering method or ion plating method to put the insulating material upon electroconductive treatment.

When the substrate is transparent, it may be used as a substrate for introducing and emitting light. Given as examples of light transmitting materials used as the transparent substrate are transparent materials including transparent inorganic materials such as glass, quartz, and sapphire; films or plates of transparent organic materials such as polycarbonate and epoxy resins; optical fibers and SELFOC optical plates.

When the transmitting material is insulated, it may be provided with electroconductive treatment before use. For instance, substrates produced either by forming a film of a transparent electroconductive material such as ITO, zinc oxide, tin oxide, lead oxide, indium oxide or copper iodide by a vapor deposition, ion plating or sputtering method or by forming a film which is so thin as to be semi-transparent of a metal such as Al, Ni or Au by vapor deposition or sputtering are used as the substrate of the present invention. The film produced by the aforementioned electroconductive treatment may be used as a transmitting electrode.

As the nitrogen compound (nitrogen source) introduced from at least one end of a gas introduction pipe mentioned below, a vapor such as $N_2$, $NH_3$, $NF_3$, $N_2H_4$, monomethylhydrazine or dimethylhydrazine or a mixed gas produced by bubbling each of these gases using a carrier gas may be used.

As the carrier gas, a rare gas such as He gas or Ar gas, a single element gas such as $H_2$ or $N_2$, a hydrocarbon such as methane or ethane or a halogenated carbon such as $CF_4$ or $C_2F_6$ may be used.

As the organic metal compound containing a IIIA element which is introduced from at least one end of the gas introduction pipe, a liquid or solid of trimethyl aluminum, triethyl aluminum, t-butyl aluminum, trimethyl gallium, triethyl gallium, t-butyl gallium, trimethyl indium triethyl indium or t-butyl indium is vaporized and may be used either singly or as a mixed gas produced by bubbling each of these gases using a carrier gas.

Next, the second invention of the present application will be explained in detail.

As the substrate used in the present invention, among substrates which are heat resistant at 600° C. or less, monocrystal silicon, polycrystal silicon, microcrystal silicon, hydrogenated amorphous silicon or the like is preferably used.

When the microcrystal silicon or hydrogenated amorphous silicon is used as the substrate, it may be formed on a glass substrate, on a glass substrate produced by applying a transparent electroconductive film of, for example, ZnO, $SnO_2$ or InSnO onto glass or on a metal substrate made of, for example, aluminum, stainless steel or nickel. The substrate may contain germanium. Germanium may be contained either in the entire substrate or in a portion of the layers.

The resistance of the substrate may be controlled by doping and the substrate may be a p-type, i-type or n-type, The crystalline plane orientation of the silicon crystal which may be used is (100), (110) or (111).

The temperature to which these substrates can be used is determined in such a manner by the generation of cracks and peeling caused by differences in the thermal expansion coefficient between the substrate and the film to be formed. The temperature is also determined depending on the heat resistance (for example, softening point, crystallizing temperature and extraction of the structural elements and doping elements) of the substrate itself. It is difficult for even microcrystal silicon as well as hydrogenated amorphous silicon to maintain the functions of a substrate at temperatures above 600° C. when hydrogenating-annealed and doped in the subsequent steps. In the case of crystal silicon, its thermal expansion coefficient and lattice constant largely differ from those of the nitride compound semiconductor and hence better results cannot be obtained at temperatures above 600° C.

A film can be formed directly on these substrates, which have been considered to be difficult to form a film on, by using this film-forming method performed at low temperatures.

Preferable examples of the IIIA elements include aluminum, gallium and indium. As specific examples of these elements, those exemplified previously are given.

In the present invention, the ratio of the total amount x of Al, Ga and In to the amount y of nitrogen, namely x:y= 0.5:1.0 to 1.0:0.5 preferably and x:y=0.8:1.0 to 1.0:0.8 more preferably.

To impart transparency and to form a barrier, each of these p-type, i-type and n-type films may comprise a different composition consisting of Al, Ga, In and N represented by $Al_xGa_yIn_z$ (x=0–1.0, y=0–1.0, Z=0–1.0) . Also, a laminate comprising laminated p-type, i-type and n-type layers may be further laminated a plurality of times. In this case, each layer may comprise a different composition represented by the following formula and having the following ratio of components:

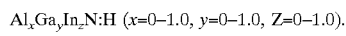

$Al_xGa_yIn_zN$:H (x=0–1.0, y=0–1.0, Z=0–1.0).

As the nitrogen element and the carrier gas, those exemplified previously may be used.

The semiconductor device of the present invention may contain hydrogen in a content of 50 atom % or less and preferably 15 atom % or less. A slight amount of hydrogen is incorporated into bond defects in the crystal at low temperatures to work for electric compensation, which improves photoelectric properties in particular.

The crystal system may be substantially either one of a cubic system or a hexagonal system. Preferably there are three or less crystalline plane orientations. The growth section may take a form of a column structure or of a smooth monocrystal.

The absolute amount of hydrogen can be measured by hydrogen forward scattering (HFS) or can be estimated by the infrared absorption spectrum. Alternatively the amount of hydrogen can be estimated by the measurement either of the amount of hydrogen released by heating or of its infrared absorption spectrum.

Figure 10:
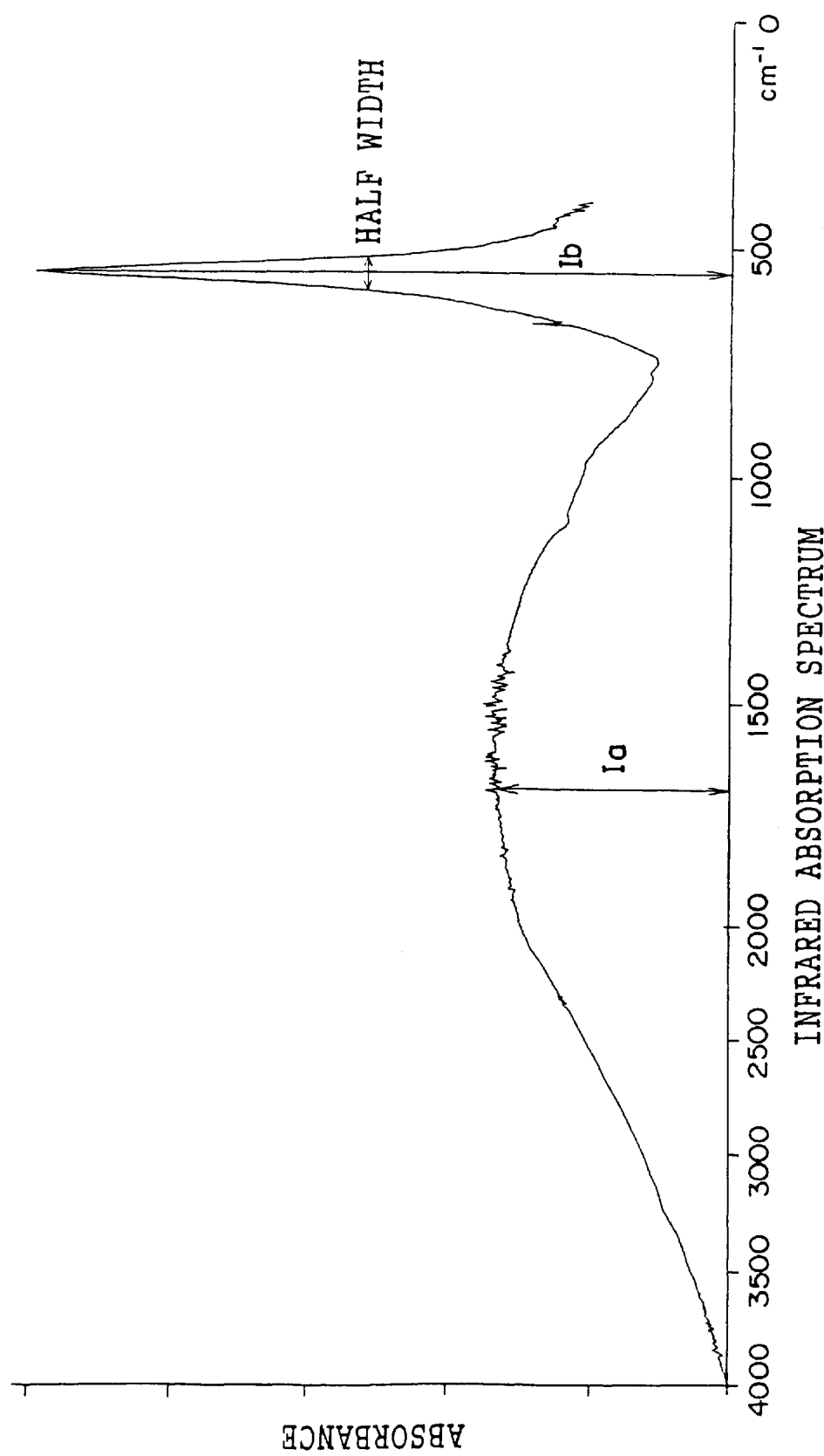
FIG. 10 is a graph showing an infrared absorption spectrum of a film on a Si substrate after the film is formed according to a second invention.

FIG. 10 is a graph showing an instance of the infrared absorption spectrum of a GaN film formed using Si (100) as a substrate by a remote plasma organic metal chemical deposition method. Here, since gallium is used as the IIIA element, there are in this spectrum a weak absorption peak due to the stretching vibration of N—H which is observed in the vicinity of a wavelength of 3230 cm$^{-1}$ and an absorption peak due to the stretching vibration of Ga—H which is observed in the vicinity of a wavelength of 2100 cm$^{-1}$. Also, a broad absorption is found at wavelengths ranging between 3000 cm$^{-1}$ and 700 cm$^{-1}$ in this spectrum.

The present invention is characterized by the absorption observed at wavelengths ranging between 3000 cm$^{-1}$ and 700 cm$^{-1}$ in the infrared absorption spectrum. The absorption mentioned here means a broad absorption, which, as shown in FIG. 10, forms a gentle quadratic curve and has no sharp peak even at the position corresponding to the maximum absorbance.

In the infrared spectrum, a sharp absorption due to the skeletal vibration of Ga—N is also observed at wavelengths ranging between 700 cm$^{-1}$ and 400 cm$^{-1}$ Among these absorptions, the broad absorption observed at wavelengths ranging between 3000 cm$^{-1}$ and 700 cm$^{-1}$ and the sharp absorption due to the skeletal vibration of Ga—N observed at wavelengths ranging between 700 cm$^{-1}$ and 400 cm$^{-1}$ deeply relate to the crystallinity of the film which is formed directly on the Si substrate. It was confirmed that the crystallinity of the film on the silicon substrate is improved with the intensity of the broad absorption and with the sharpness of the absorption width of the end of the Ga—N absorption.

It was also found that, when, for instance, Ga was used as the IIIA element, the quality of the semiconductor device was determined by making use of the infrared absorption spectrum, specifically, by the intensity ratio of the maximum absorbance (Ia) in the broad absorption observed at wavelengths ranging between 3000 cm$^{-1}$ and 700 cm$^{-1}$ to the maximum absorbance (Ib) in the sharp absorption due to the skeletal vibration of Ga—N observed at wavelengths ranging between 700 cm$^{-1}$ $^1$ and 400 cm$^{-1}$ Specifically, when the ratio (Ia/Ib) of both maximum absorbances is 0.01 or more, high quality crystals can be grown on the Si substrate.

Moreover, from the result of the measurement of an absorption peak observed in the vicinity of a wavelength of 550 cm$^{-1}$ in the infrared absorption spectrum, the half width of the absorption peak is preferably 150 cm$^{-1}$ or less. The half width mentioned herein means the width of a wavelength range at a height of half the maximum absorbance in the absorbance primarily of the bond between an atom of the IIIA element and a nitrogen atom. Alternatively, in the case where the width of the wavelength range in the low frequency side is measured only imperfectly, the objective half width is calculated by doubling a half width of the complementary half of one high frequency side.

From the result of the observation by a transmission electron beam diffraction pattern and a ring diffraction pattern of reflecting electron beam diffraction, such a crystal is found to take a form very like a spot, a spot form and further a screen form. X-ray diffraction will show that one crystalline plane orientation generally occupies 80% or more of the strength of the whole.

Although gallium is used as the IIIA element in the instance mentioned previously, IIIA elements such as aluminum and indium may be further mixed in addition to gallium. Even in this case, the same relation as above may be applied. Absorption peaks (III-H) showing the bond between the IIIA elements and hydrogen, when plural IIIA elements are used, can be calculated by summing up absorption peaks (for instance, each peak of Al—H, Ga—H and In—H bonds) showing the bonds between each element and hydrogen. For example, when In is added, the absorption peak shifts 10 to 50 cm$^{-1}$ to the low frequency side, but the same relation as above can be applied. Absorption peaks derived from other bonds likewise shift depending on the condition and the elements, but the intensity of absorption peaks may be likewise handled.

The optical gap of the film can be varied optionally by controlling the ratio of the IIIA element to be mixed. Taking up GaN as a standard, when it is intended to obtain a voltage higher than 3.5 eV, Al is added to increase the voltage up to 6.5 eV. Also, the voltage is changed up to 1.9 eV by the addition of In when light in a visible range is used.

The composition of each element in the film can be measured by methods using an X-ray photoelectron spectroscopy (XPS), electron microprobe, Rutherford back scattering (RBS), or secondary ion mass analyzer.

The size of the crystal is preferably 5 nm or more, which can be measured by X-ray diffraction or electron beam diffraction or by measuring the shape using an electron microphotograph of the section.

The semiconductor device of the present invention may be used as a light receiving element.

In this case, the semiconductor may be a single layer or a tandem-type multilayer structure in which the optical gap increases in order toward the side of incident light. The semiconductor of the present invention may be made into wavelength separation type light-receiving element by drawing current separately from each layer with a different optical gap. Visible light can be separated from short wave light and insufficiency in the sensitivity of silicon optics to short wave can be covered by forming the aforementioned layer on a silicon substrate which is made of crystal silicon, polycrystal silicon or hydrogenated amorphous silicon and which has a light-receiving element structure such as a pin structure.

The semiconductor device of the present invention can be used as a light emitting element.

In this case, an inexpensive silicon substrate can be used as an electroconductive electrode in place of conventional expensive sapphire substrate and emitting diodes or lasers driven by a transistor or an integrated circuit formed on a silicon substrate can be formed. This enables the integration of electronic elements with light-emitting elements.

The semiconductor device of the present invention can be used as a photoelectromotive element. To state the most simple case, a transparent electroconductive film of, for instance, ITO or $SnO_2$ or a thin metal film is used as an electrode for a film of the above nitride compound on an opaque metal or silicon substrate to form a Schottky barrier where electromotive force is produced. In this case, the semiconductor device of the present invention may be used as a window material in the side of incident light in conventional silicon type solar cells and may be made into highly efficient solar cells by laminating films of nitride compounds having optical gaps larger than the optical gaps of a silicon type solar cell to form a tandem structure.

When crystal silicon is used to manufacture a substrate, films of nitride compounds having optical gaps larger than that of the crystal silicon are laminated so as to have an np type, nip type, pn type or pin type structure on the crystal silicon having an np type or pn type structure to provide a transparent electrode on the incident light side.

The semiconductor device of the present invention can have its optical gap optionally changed. Two or more films of nitride compounds having different optical gaps are laminated as an active region for generating carriers according to the absorption wavelengths so as to have an npnp structure, nipnip structure, pnpn structure or pinpin structure in such a manner that the optical gaps increase toward the side of incident light thereby forming a tandem structure. A tandem structure may be formed by two or more layers.

When microcrystal silicon or hydrogenated amorphous silicon is used, highly efficient solar cells can be manufactured using the same structure as above.

On a nitride compound which is formed on a transparent electroconductive substrate introducing incident light and having a heat resistant temperature of 600° C. or less, so as to have an np structure, pn structure, nip structure or pin structure or a repeated structure of a type where the optical gaps increase towards the side of the transparent electroconductive substrate, microcrystal silicon or hydrogenated amorphous silicon may be provided.

Such a structure ensures that light from green to blue and even to the UV region with a maximum radiation intensity of a solar light spectrum at which the efficiency of a silicon type solar cell decreases can be utilized efficiently whereby a highly efficient solar cell can be produced.

When crystal silicon, polycrystal silicon or hydrogenated amorphous silicon containing germanium is used, light in a broad wavelength range from a short wave light region including a UV region to a long wavelength light region including an infrared region can be utilized.

The semiconductor device of the present invention can have its optical gap made variable over the whole range from an infrared region to a UV region and can hence make use of light in a broad range from an infrared region to a UV region when it is used for light receiving elements, light emitting elements, electromotive force elements and the like. The semiconductor device also has excellent light resistance, heat resistance and resistance to oxidation and enables high speed and highly functional optoelectronic elements to be attained.

Next, the method (the third and fourth invention of this application) and apparatus (the fifth invention of this application) for the production of the semiconductor device of the first and second inventions of this application will be explained with reference to the drawings.

FIG. 1 shows a schematic structure of an apparatus 10 for the production of a semiconductor device according to a first embodiment of the present invention. This semiconductor device producing apparatus 10 comprises a cylindrical reactor 12, first and second raw material activating/supplying sections 14 and 16 connected to the reactor 12 via openings 12A and 12B respectively, an exhaust pipe 18 connected to the reactor 12 via an opening 12C to expel gas contained in the reactor 12, a substrate holder 20 disposed within the reactor 12 to support a substrate and a heater 22 disposed in the side opposite to the ground plane where the substrate of the substrate holder 20 is provided.

The first and second raw material activating/supplying sections 14 and 16 have the same structures. Each of these sections 14 and 16 is provided with a cylindrical quartz pipe 24 communicated with the reactor 12 and disposed outside in the radial direction of the reactor 12, a gas introduction pipe 25 communicated with the quartz pipe 24 at the side opposite to the reactor 12, a microwave waveguide 28 disposed so as to cross the quartz pipe 24 and a gas introduction pipe 30 connected to the quartz pipe 24 at the side closer to the reactor 12 than the position where the quartz pipe 24 crosses the microwave waveguide 28. The microwave waveguide 28 has a rectangular form and the quartz pipe 24 penetrates through the waveguide 28.

The gas introduction pipes 25 and 30 of the first and second raw material activating/supplying sections 14 and 16 are connected to sylinders or the like (not shown) as gas supplying means for supplying gas.

A flow regulator 31 for supplying raw gas intermittently is connected to the gas introduction pipe 30. The microwave waveguide 28 is connected to a microwave oscillator using an unillustrated magnetron and is allowed to discharge within the quartz pipe 24. The exhausting pipe 18 is connected to a pump as an unillustrated exhaust means and serves to reduce the amount of gas in the reactor 12 to almost a vacuum.

Figure 2:
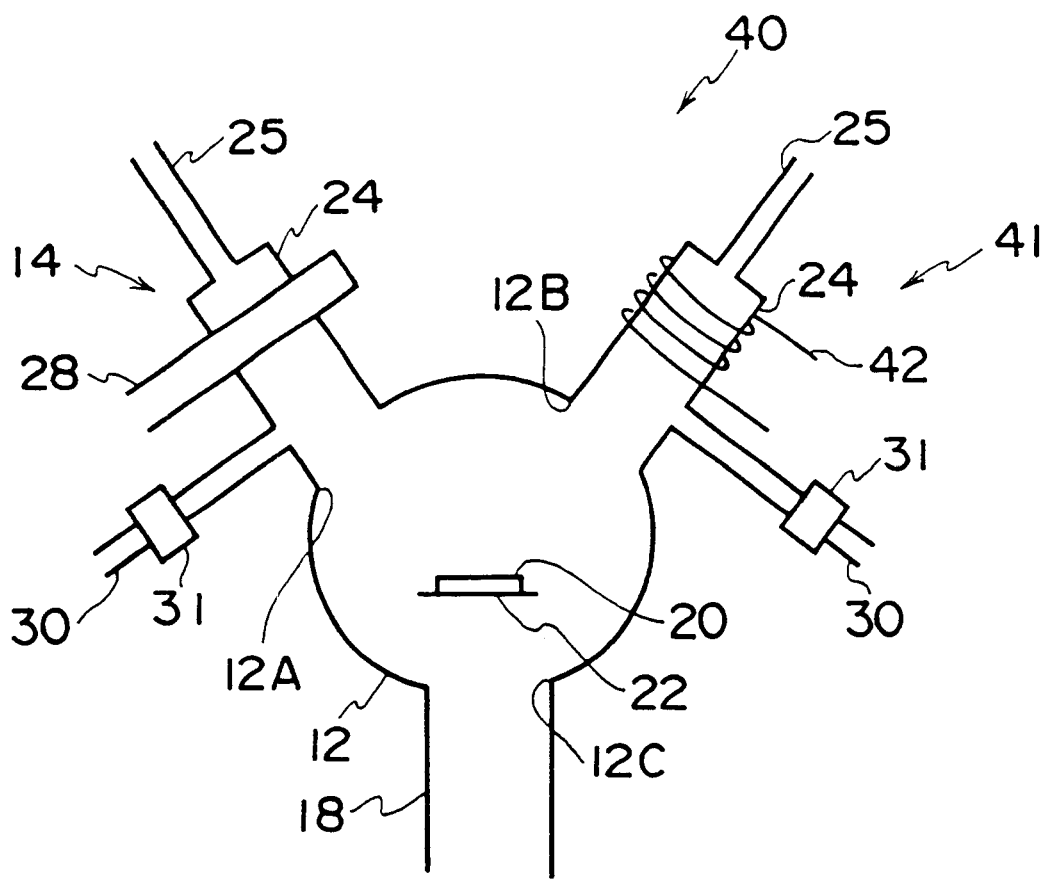
FIG. 2 is a schematic structural view of an apparatus for the manufacturing of a semiconductor device according to a second embodiment of the present invention.

FIG. 2 shows a schematic structure of an apparatus 40 for the production of a semiconductor device according to a second embodiment of the present invention. Incidentally, in the semiconductor device-producing apparatus 40 explained hereinafter, each of the same parts as in the semiconductor device-producing apparatus 10 according to the first embodiment are represented by the same symbol and an explanation thereof is omitted.

The semiconductor device-producing apparatus 40 is provided with a second raw material activating/supplying section 41 in place of the second raw material activating/supplying section 16 in the semiconductor device-producing apparatus 10. In the second raw material activating/supplying section 41, a high frequency coil 42 is used in place of the microwave waveguide 28. The high frequency coil 42 is wound around the outer periphery of the quartz pipe 24 and is connected to an unillustrated high frequency oscillator.

Figure 3:
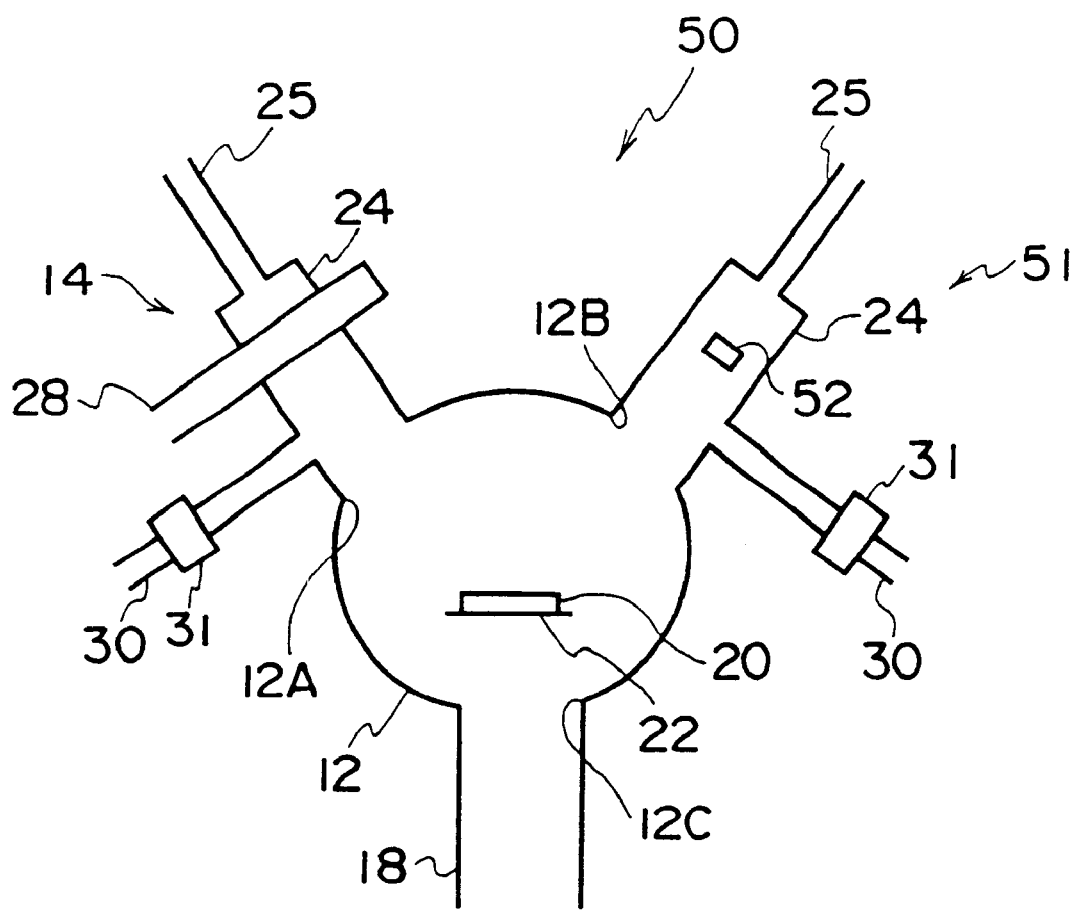
FIG. 3 is a schematic structural view of an apparatus for the manufacturing of a semiconductor device according to a third embodiment of the present invention.

FIG. 3 shows a schematic structure of an apparatus 50 for the production of a semiconductor device according to a third embodiment of the present invention. Incidentally, in the semiconductor device-producing apparatus 50 explained hereinafter, each of the same parts as in the semiconductor device-producing apparatus 10 according to the first embodiment are represented by the same symbol and an explanation thereof is omitted.

The semiconductor device-producing apparatus 50 is provided with a second raw material activating/supplying section 51 in place of the second raw material activating/supplying section 16 in the semiconductor device-producing apparatus 10. In the second raw material activating/supplying section 51, a glow discharge electrode 52 which is disposed within the quartz pipe 24 is used in place of the microwave waveguide 28 and generates a capacitive coupling-type discharge.

In these semiconductor device-producing apparatuses 10, 40 and 50, for instance, a nitrogen source is introduced continuously from the gas introduction pipe 25 of the first raw material activating/supplying section 14 and is plasma-activated by microwave discharge. An organic metal compound containing a IIIA group element is supplied intermittently from the gas introduction pipe 30 of the first raw material activating/supplying section 14 and a hydrogen compound as an assistant material is supplied from the gas introduction pipe 25 of each of the second raw material activating/supplying sections 16, 41, and 51. In this case, two or more organic metal compounds may be mixed and supplied at the same time from the gas introduction pipe 30. An organic metal compound containing a IIIA element is also supplied intermittently from the gas introduction pipe 30 of each of the second raw material activating/supplying sections 16, 41, and 51.

In the semiconductor device-producing apparatuses 10, 40, and 50, for instance, a nitrogen source is supplied from the gas introduction pipe 25 of the first raw material activating/supplying sections 14 and two or more organic metal compounds respectively containing different IIIA elements may be supplied from the gas introduction pipe 30 of each of the first and second raw material activating/supplying sections 14, 16, 41, and 51 either simultaneously or so as not to overlap each other. Furthermore, discharge conditions and gas flow rates can be varied in each raw material activating/supplying section to change the activating conditions of a VA element corresponding to the bond energy of each organic metal compound. Accordingly, if each of these semiconductor device-producing apparatuses 10, 40, and 50 is used, a film contaminated with few impurities or a high quality film of a mixed crystal can be formed.

Figures 1, 4:
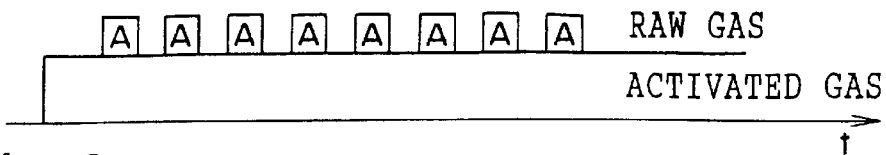
Figures 2, 4:
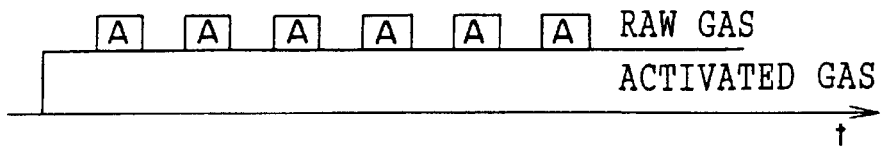
Figures 3, 4:
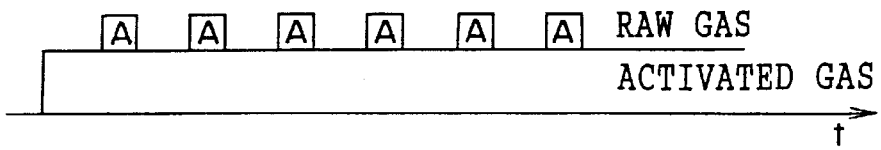
Figure 4:
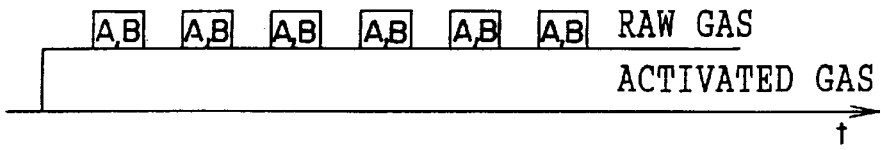
Figures 4, 5:
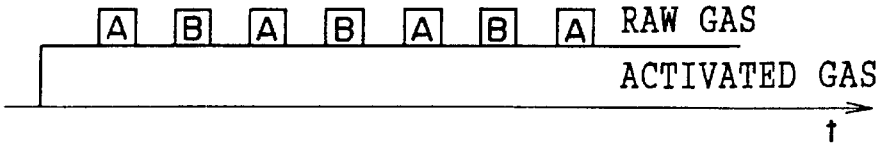
Figures 4, 5, 6:
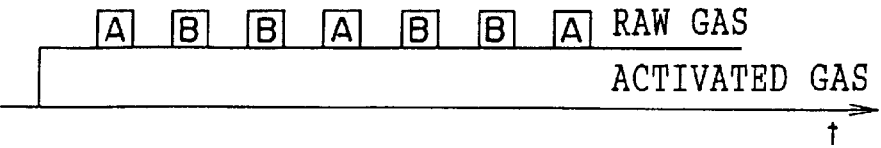

The intermittent introduction of the organic compound containing the IIIA element may be made using a mass flow controller by an on-off operation controlled by external signals or by an opening and closing operation or switching operation of a valve. FIGS. 4-1 to 4-7 show an instance of the timing sequences for the introduction. When the organic compound containing the IIIA element is introduced intermittently, the time required for introducing gas may be either the same (FIG. 4-1) as or different (FIGS. 4-2 and 4-3) from the time suspended. Also, different raw materials may be mixed and introduced intermittently (FIG. 4-4). Further, different raw materials may be alternately introduced intermittently (FIG. 4-5) and either one of them may be supplied repeatedly (FIG. 4-6). Furthermore, one raw material and a mixture of raw materials may be supplied alternately (FIG. 4-7). A mixed crystal compound having a desired composition can be obtained by supplying a plurality of raw materials in such a manner.

The intermittent introduction may be made either by an action corresponding to a rectangular wave signal or by a smooth action like a sine curve. The frequency may be 0.01 to 100 Hz provided that the time for an introduction and the time for a suspension make one cycle. This frequency must correspond to the growth rate of the film, specifically, it must be low when the growth rate is low and it must be high when the growth rate is high. It is desirable that the frequency be designed to be one cycle for one layer.

In the embodiment of the present invention, as the activating method in the raw material activating/supplying section, any one of a glow discharge method, microwave discharge method, electron cyclotron resonance method and helicon plasma method may be adopted. A method using a heating filament may be used. These methods may be used either independently or in combinations of two or more. Also, in the case of using the glow discharge, an inductive coupling type like that used in the second embodiment or a capacitive type like that used in the third embodiment may be used.

When two or more activating methods are used in one space, it is necessary that all discharges take place at the same time under the same pressure. Therefore, there may be a difference between the pressure in the waveguide for microwave (or in the high frequency waveguide) and the pressure in the quartz pipe (or in the reactor). In the case where these pressures are the same, the excitation energies of the activated groups can be greatly changed by using different raw material activating means, for instance, microwave discharge and glow discharge, whereby the film quality can be controlled.

Other than the above methods, a usual organic metal vapor phase growth method or molecular beam epitaxial method may be used. In this case, it is effective to use activated nitrogen or activated hydrogen at the same time in these methods.

As the assistant material which reacts with an organic functional group of the organic metal compound containing the IIIA element to exclude the organic functional group from the reaction system, hydrogen, compounds including hydrogen, rare gases such as He, Ne or Ar or halogen gas such as $F_2$ or $Cl_2$ may be used either singly or as a mixture. These assistant materials may be mixed with the nitride compound upon use. The assistant material may be used optionally to control the energy of the activated groups and to prevent the defects of the film by converting the organic functional group into an inert molecule.

Compounds containing pn control elements may be introduced from the gas introduction pipe 30 to dope the film. The doping gas may be either combined with or introduced separately from the organic compound containing the IIIA element. Also, the doping gas and the organic metal compound may be introduced either at the same time or by turns.

Examples of the n-type element used in the present invention include Li of the group IIIA (Group number 1 in a revised edition of Inorganic Chemistry Nomenclature in 1989 by IUPAC); Cu, Ag and Au of the group IB (Group number 11 in a revised edition of Inorganic Chemistry Nomenclature in 1989 by IUPAC); Mg of the group IIA (Group number 2 in a revised edition of Inorganic Chemistry Nomenclature in 1989 by IUPAC); Zn of the group IIB (Group number 12 in a revised edition of Inorganic Chemistry Nomenclature in 1989 by IUPAC); C, Si, Ge, Sn and Pb of the group IVA (Group number 14 in a revised edition of Inorganic Chemistry Nomenclature in 1989 by IUPAC) and S, Se and Te of the group VIA (Group number 16 in a revised edition of Inorganic Chemistry Nomenclature in 1989 by IUPAC). Among these elements, C, Si, Ge and Sn are desirable in view of the controllability of a charge carrier.

Examples of the p-type element used in the present invention include Li, Na and K of the group IA; Cu, Ag and Au of the group IB; Be, Mg, Ca, Sr, Ba and Ra of the group IIA; Zn, Cd and Hg of the group IIB; C, Si, Ge, Sn and Pb of the group IVA; S, Se and Te of the group VIA (Group number 16 in a revised edition of Inorganic Chemistry Nomenclature in 1989 by IUPAC); Cr, Mo and W of the group VIB (Group number 6 in a revised edition of Inorganic Chemistry Nomenclature in 1989 by IUPAC); Fe of the group VIII (Group number 8 in a revised edition of Inorganic Chemistry Nomenclature in 1989 by IUPAC); Co (Group number 9 in a revised edition of Inorganic Chemistry Nomenclature in 1989 by IUPAC); and Ni (Group number 10 in a revised edition of Inorganic Chemistry Nomenclature in 1989 by IUPAC). Among these elements, Be, Mg, Ca, Zn and Sr are preferred in view of the controllability of the charge carrier.

It is necessary to prevent hydrogen in the film from combining with a dopant and thereby to protect the dopant from being inactivated. Therefore, as the n-type element, particularly C, Si, Ge or Sn is preferred and, as the p-type element, particularly Be, Mg, Ca, Zn or Sr is preferred with the view of combining hydrogen, which is used for the passivation of a defect level, with IIIA elements and nitrogen elements more selectively than with a dopant.

The semiconductor device of the present invention may comprise an n-type or p-type nitride compound containing at least one element selected from the group consisting of Al, Ga and In, nitrogen and hydrogen. In the semiconductor of the present invention, further a film $p^+$ and an $n^+$ layer which are highly doped or a film $p^-$ and an $n^-$ layer which are less doped may be interposed.

For the doping, $SiH_4$, $Si_2H_6$, $GeH_4$, $GeF_4$ or $SnH_4$ may be used as the n-type dopant and $BeH_2$, $BeCl_2$, $BeCl_4$, cyclopentadienyl magnesium, dimethyl calcium, dimethyl strontium, dimethyl zinc or diethyl zinc my be used as the p-type dopant in the gas state. The doping element may be either diffused in the film as it is or incorporated as an ion into the film.

Next, the production method of the second invention of this application will be explained in more detail using the semiconductor device-producing apparatus shown in FIG. 2.

In this apparatus, using, for instance, $N_2$ gas as the nitrogen element, it is introduced into the quartz pipe 24 from the gas introduction pipe 25 of the first raw material activating/supplying section 14. A microwave is supplied to the microwave waveguide 28 which is connected to the microwave oscillator (not shown) using a magnetron to give rise to discharge in the quartz pipe 24. While, for instance, $H_2$ gas is introduced into the quartz pipe 24 from the gas introduction pipe 25 of the second raw material activating/supplying section 41. A high frequency wave is supplied to the high frequency coil 42 from the high frequency oscillator (not shown) to give rise to discharge in the quartz pipe 24. While, for instance, trimethyl gallium is introduced from the gas introduction pipe 30 of the second raw material activating/supplying section 41 and supplied from the downstream side of the discharge field to form a film of a gallium nitride crystal on the substrate.

In the case where the substrate temperature is high and/or the flow amount of a raw gas of the IIIA element is small, the semiconductor of the IIIA element tends to be crystallized. The crystallizing tendency depends on conditions such as the type of substrate, the substrate temperature, the flow amount and pressure of the gas or the discharge output. The heat resistant temperature of the substrate used in the present invention is 600° C. or less and preferably in a range between 100 and 600° C. When the substrate temperature is lower than 300° C. and the flow rate of the raw gas of the IIIA element is small, the semiconductor of the IIIA element tends to be crystallized. On the other hand, when the substrate temperature is higher than 300° C., the semiconductor tends to become a crystal. $H_2$ discharge, for instance, can further progress crystallization. Organic metal compounds containing aluminum or indium or a mixture of these metals may be used in place of trimethyl gallium. These organic metal compounds may be introduced separately from the gas introduction pipe 30 of the first raw material activating/supplying section 14.

Moreover, a gas containing at least one element selected from the group consisting of C, Si, Ge and Sn or a gas containing at least one element selected from the group consisting of Be, Mg, Ca, Zn and Sr is introduced from the downstream side (the gas introduction pipe 30 of the first and second raw material activating/supplying sections) of a discharge space to thereby form a film of an n-type, p-type or desirable electroconductive amorphous, microcrystal or crystal nitride compound on a crystal silicon substrate, microcrystal silicon substrate or hydrogenated silicon substrate. When C (carbon) is used, carbon from an organic metal compound may be used depending on the conditions.

In the above apparatus, the activated nitrogen and activated hydrogen produced by discharge energy may be separately controlled. A gas, such as $NH_3$, containing both a nitrogen atom and a hydrogen atom may be used. Further $H_2$ may be added. Also, conditions in which the activated hydrogen is isolated and produced from the organic metal compound may be employed. With such a structure, an activated atom of the IIIA element and nitrogen atom exist under control on the substrate and the hydrogen atom inactivates a methyl group, ethyl group into methane and ethane respectively, whereby a crystal film limited in film defects can be formed even at low temperature.

The present invention will be explained in more detail by way of examples, which are not intended to be limiting of the present invention.

EXAMPLE 1

Using the semiconductor device-producing apparatus 40 shown in FIG. 2, each of a substrate produced by applying ITO onto the surface of Corning 7059 glass by sputtering, a washed sapphire substrate, quartz substrate, Si wafer and Al substrate was placed on a substrate holder 20 and was heated to 350° C. after the system was evacuated. 500 sccm of $N_2$ gas was introduced into the quartz pipe 24 with a diameter of 25 mm from the gas introduction pipe 25 of the first raw material activating/supplying section 14. The output of a 2.45 GHz microwave was set to 300 W and the matching of the microwave was made using a tuner to discharge. The output of the reflecting wave at this time was 0 W. While, 500 sccm of $H_2$ gas was introduced into the quartz pipe 24 from the gas introduction pipe 25 of the second raw material activating/supplying section 41 to perform glow discharge at a frequency of 13.56 MHz. The output of the glow discharge was 100 W and the output of the reflecting wave at this time was 0 W.

In this condition, trimethyl gallium (TMG) which used nitrogen gas as a carrier gas and was kept at 0° C. was introduced from the gas introduction pipe 30 of the first raw material activating/supplying section 14 through a mass flow controller in an intermittent mode in which an operation of the introduction of 1.0 sccm gas for 0.5 seconds and a successive suspension of operation for 5 seconds were performed in one cycle. At this time, emission and extinction of a Ga atom in the remote plasma were repeated so as to substantially follow introduction of TMG. The pressure in the reactor 12 measured at this time by a Baratron (Trademark) vacuum gauge was 27 Pa.

The film formation was continued for one hour to measure the composition of the film by XPS. As a consequence the Ga/N ratio was 0.9 almost corresponding to the stoichiometric ratio.

Figures 4, 5, 6, 7:
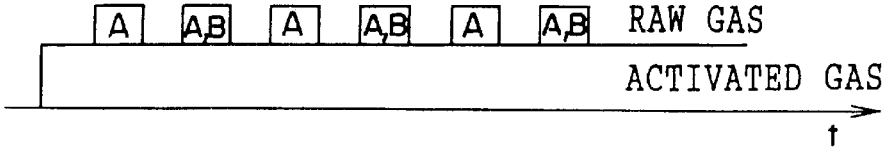
Figure 5:
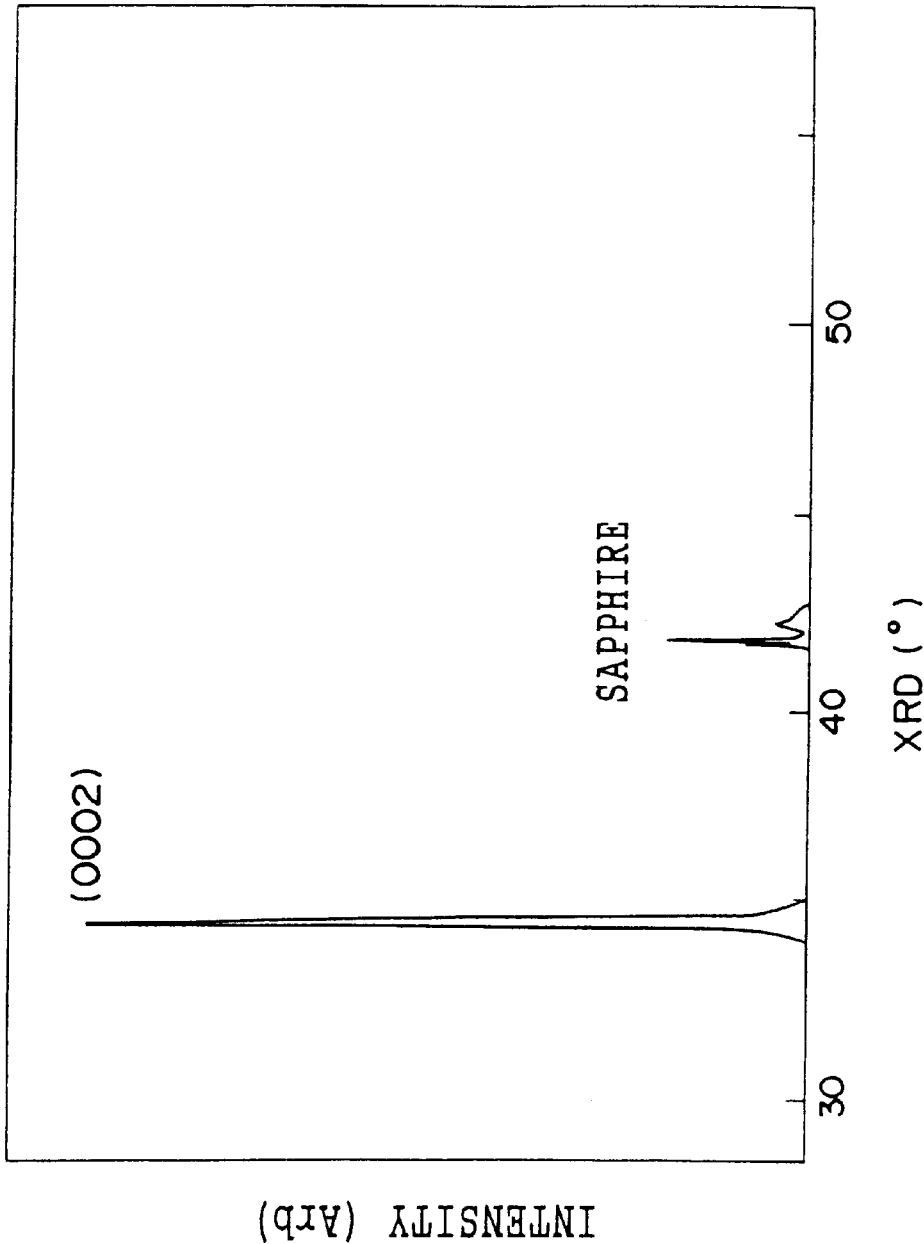
Figure 6:
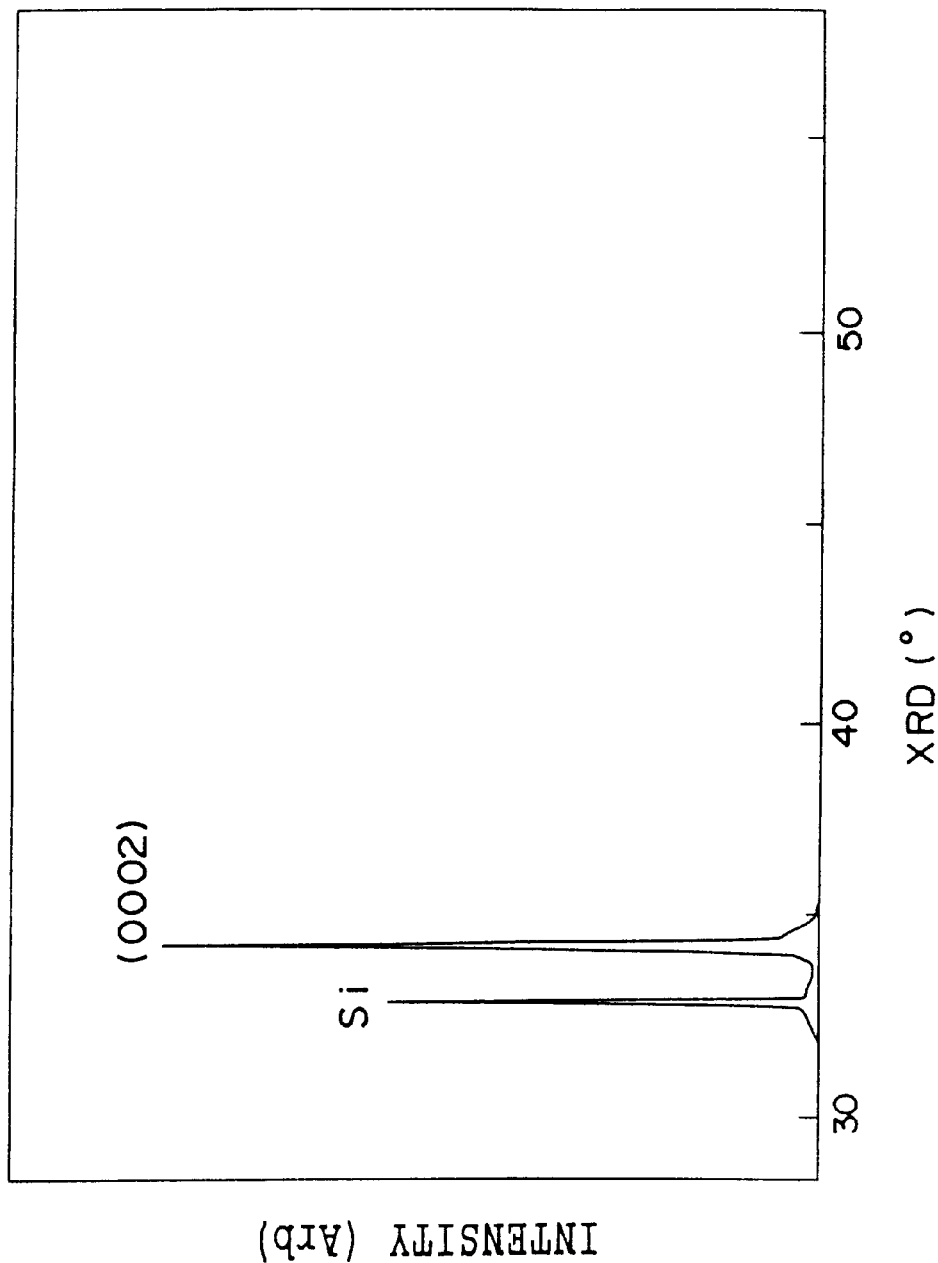
Figure 7:
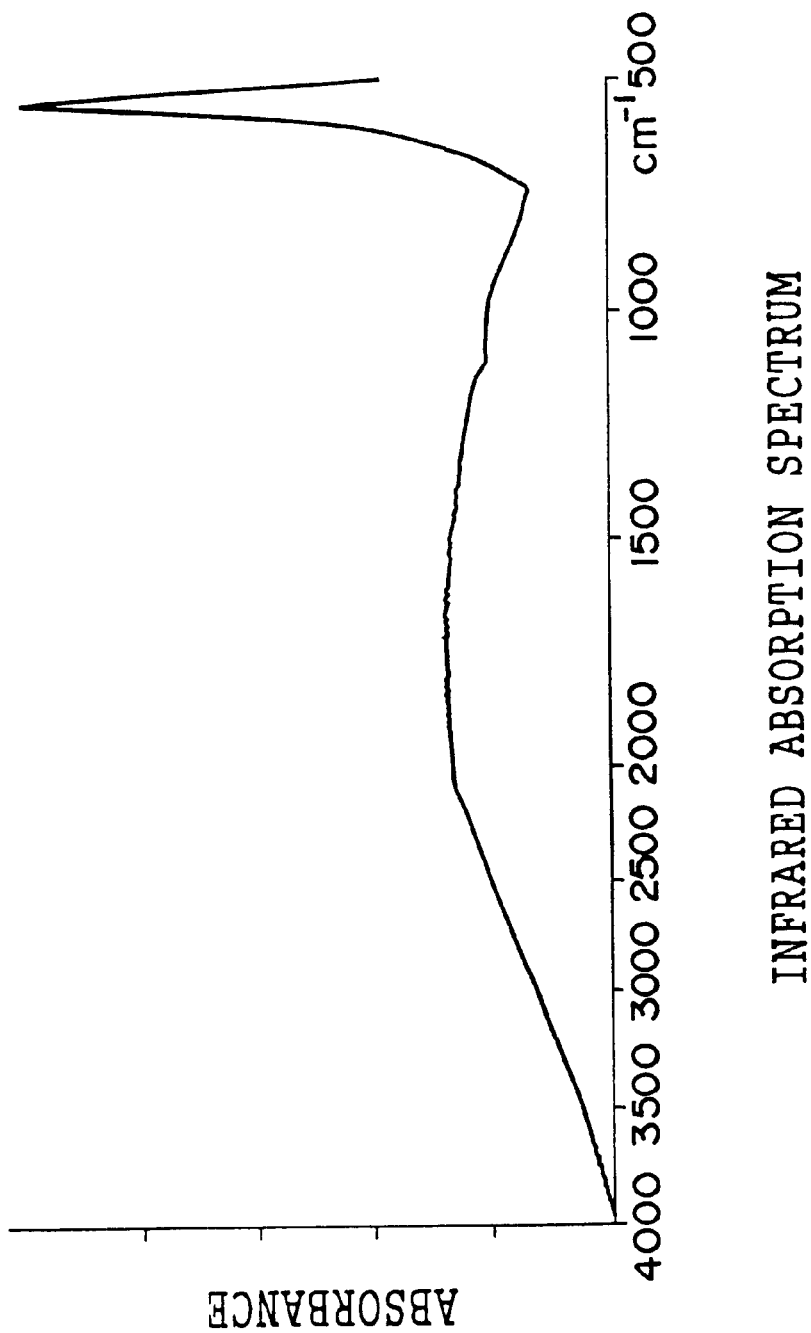
Figure 8:
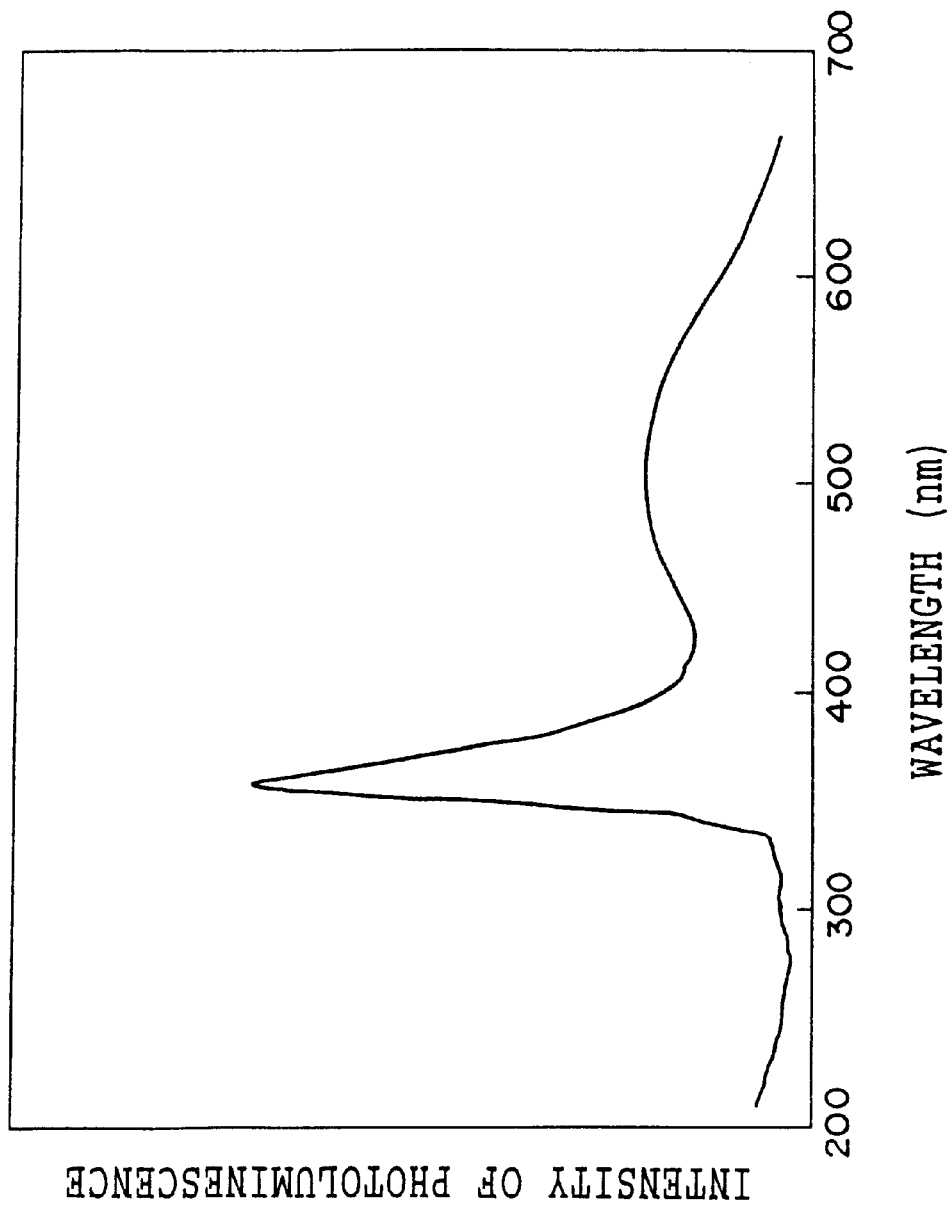
FIG. 8 is a graph showing the photoluminescence of a film on a Si substrate after the film is formed in example 1.
Figure 9:
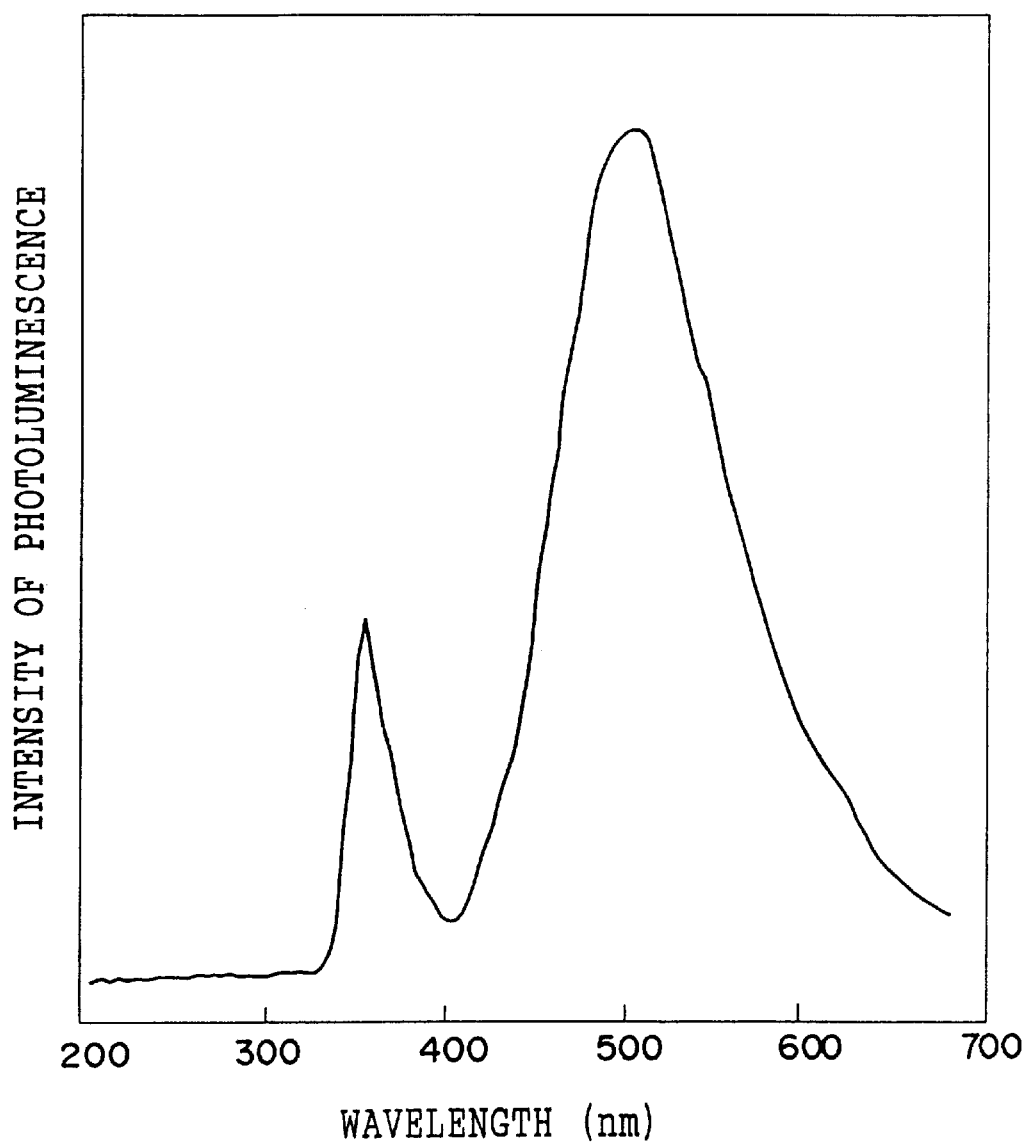
FIG. 9 is a graph showing the photoluminescence of a film on an Al substrate after the film is formed in example 1.

FIGS. 5 and 6 show the XRD of each of the films formed on the sapphire substrate and the Si substrate. As shown in these figures, a peak signal of (0002) plane was observed on both the sapphire substrate and Si substrate, showing that the resulting films were monocrystals. FIG. 7 shows the infrared spectrum of the film on the Si substrate. It was confirmed from the figure that no absorptions of NH and GaH were found and the width of the absorption peak of GaN was 60 $cm^{-1}$, showing that the resulting film had better crystallinity. Meanwhile, 325 nm UV-rays from a 20 mW He-Cd laser were applied at 25° C. at an angle of about 45 degrees onto the surface of the GaN film. An emission spectrum, in a range from 200 to 700 nm, of the photoluminescence led by an optical fiber into a slit of a spectroscope (HR320 Spectroscope, manufactured by Jovin Yvon) was measured using a diode array detector (TN-6132 Diode Array Photodetector manufactured by Tracer Northern Corp. in which the sensitivity to a short wave is sensitized by scintillation). The photoluminescence of each of the samples of the films formed on the substrates was measured at room temperature to confirm strong band edge emission at 365 nm. In the case of the film formed on the Si substrate, strong band edge emission was observed at 365 nm as shown in FIG. 8. Less emission at long wavelength was observed in this emission and it was hence confirmed that the resulting film was a high quality crystal. FIG. 9 shows the photoluminescence of the GaN film formed on the aluminum substrate. The intensity of the emission was strong and although band edge emission was observed likewise, strong long wave emission from the deep level was also observed. In the case of the ITO substrate, clear but slightly weak band edge emission was confirmed.

Comparative Example 1

A film was formed in the same manner as in EXAMPLE 1 except that TMG was continuously supplied at an average flow rate of 0.5 sccm. The film formation was continued for one hour to measure the XRD of each of the films formed on the sapphire substrate and the Si substrate. As a result, other than the peak signal of (0002) plane, for example, the peak signals of the following two- and three-crystalline plane orientations were observed and it was hence confirmed that the resulting film was a polycrystal.

$(10\bar{1}0) \ (10\bar{1}1)$

The infrared spectrum of the film formed on the Si substrate was measured to find that NH absorption and GaH absorption were clear and much hydrogen was contained in the film. It was also confirmed that the width of the GaN peak was 100 $cm^{-1}$ and the crystallinity of the resulting film was inferior. The photoluminescence of each of the samples of the films formed on the substrates was measured at room temperature to find that weak visible emission was observed at 500 to 700 nm but no band edge emission was observed.

EXAMPLE 2

Using the apparatus shown in FIG. 1 and the same substrate at the same temperature as in EXAMPLE 1, 500 sccm of $N_2$ gas was introduced into the quartz pipe 24 with a diameter of 25 mm from the gas introduction pipe 25 of the first raw material activating/supplying section 14. The output of a 2.45 GHz microwave was set to 300 W and the matching of the microwave was made using a tuner to discharge. The output of the reflecting wave at this time was 0 W. While, 500 sccm of $H_2$ gas was introduced into the quartz pipe 24 from the gas introduction pipe 25 of the second raw material activating/supplying section 16 to perform a discharge operation using a 2.45 GHz microwave at a discharge output of 250 W. The output of the reflecting wave at this time was 0 W. In this condition, a vapor of trimethyl gallium (TMG) which was kept at room temperature was introduced from the gas introduction pipe 30 of the first raw material activating/supplying section 14 through a mass flow controller 31, capable of keeping up with an intermittent response, in an intermittent mode in which an operation of the introduction of 1 sccm gas for 3 seconds and a successive suspension of operation for 3 seconds were performed in one cycle, so as to synchronize with the supply of TMG. While, a mixed gas of trimethyl indium vapor, which was kept at 50° C. and $N_2$ carrier gas was introduced from the gas introduction pipe 30 of the second raw material activating/supplying section 16, in an intermittent mode in which an operation of the introduction of 3 sccm gas for 3 seconds (0.5 sccm of the trimethyl indium vapor) and a successive suspension of operation for 3 seconds were performed in one cycle, in such a manner that the introductions of TMG and trimethyl indium were synchronized with each other. The pressure in the reactor 12 measured at this time by a Baratron vacuum gauge was 40 Pa.

In this condition, using a quadruple pole mass analyzer, the decomposition ratios of trimethyl gallium and trimethyl indium were measured to find that the decomposition ratios of the former and latter were 99.8% and 99.9% respectively. The film formation was continued for one hour. The composition of the film was then measured by RBS (Rutherford back scattering) to find that the ratio of Ga/In was 2/1 which was the same as the ratio of the introduced gases. The ratio of (Ga+In)/N was 1.05, almost corresponding to the stoichiometric ratio, the optical gap was 2.6 eV and the half width of the diffraction peak of (0002) plane in an X-ray diffraction spectrum of the film formed on the sapphire substrate was 600 arcsec. The photoluminescence of each of the samples of the films formed on the substrates was measured at room temperature by a 20 mW He—Cd laser to confirm band edge emission at 510 nm.

EXAMPLE 3

Using the semiconductor device-producing apparatus 40 shown in FIG. 2, while the substrate temperature was set at 350° C., 500 sccm of $N_2$ gas was introduced into the quartz pipe 24 from the gas introduction pipe 25 of the second raw material activating/supplying section 41. No activation was made in the second activating/supplying section 41. A film was formed in an intermittent operation in the same conditions as in EXAMPLE 1 except for the above conditions. The film formation was continued for one hour to measure the XRD of each of the films formed on the sapphire substrate and the Si substrate. As shown in these figures, a peak signal of (0002) plane was observed on both the sapphire substrate and Si substrate, showing that the resulting films were monocrystals. The infrared spectrum of the film on the Si substrate was measured. It was confirmed that no absorptions of NH and GaH were found and the width of the absorption peak of GaN was 70 $cm^{-1}$, showing that the resulting film had better crystallinity. The photoluminescence of each of the samples of the films formed on the substrates was measured at room temperature by a 20 mW He—Cd laser to confirm a band edge emission at 365 nm. In both of the Al substrate and the ITO substrate, clear but slightly weak band edge emissions were confirmed.

Comparative Example 2

A film was formed in the same manner as in EXAMPLE 2 except that TMG was continuously supplied at an average flow rate of 0.5 sccm. The film formation was continued for one hour to measure the XRD of each of the films formed on the Si substrate and the sapphire substrate. As a result, other than the peak signal of (0002) plane, for example, the peak signals of the following two- and three-crystalline plane orientations were observed and it was hence confirmed that the resulting film was a polycrystal.

$(10\bar{1}0)$ $(10\bar{1}1)$

The infrared spectrum of the film formed on the Si substrate was measured to find that NH absorption and GaH absorption were clear and much hydrogen was contained in the film. It was also confirmed that the width of the GaN peak was 90 $cm^{-1}$ and the crystallinity of the resulting film was inferior. The photoluminescence of each of the samples of the films formed on the substrates was measured at room temperature using a 20 mW He—Cd laser to find that weak visible emission was observed at 500 to 700 nm but no band edge emission was observed.

EXAMPLE 4

The same apparatus and conditions as in EXAMPLE 2 were used, except that biscyclopentadienyl Mg which was heated to 50° C. and 10 sccm of hydrogen as the carrier gas were supplied from the gas introduction pipe 30 of the second activating/supplying section 16, to produce a p-type GaN film.

The photoluminescence of each of the samples of the films formed on the substrates was measured at room temperature by a 20 mW He—Cd laser to confirm band edge emission at 370 nm and visible emission.

EXAMPLE 5

The same apparatus and conditions as in EXAMPLE 2 were used, except that 5 sccm of silane diluted by the addition of hydrogen (100 ppm) were supplied from the gas introduction pipe 30 of the second activating/supplying section 16, to produce an n-type GaN film.

The photoluminescence of each of the samples of the films formed on the substrates was measured at room temperature by a 20 mW He—Cd laser to confirm band edge emission at 360 nm and visible emission.

EXAMPLE 6

Using the semiconductor device-producing apparatus 50 shown in FIG. 3, each of a washed sapphire substrate, quartz substrate and Si wafer was placed on a substrate holder 20 and was heated to 400° C. after the system was evacuated. 1000 sccm of $N_2$ gas was introduced into the quartz pipe 24 with a diameter of 25 mm from the gas introduction pipe 25 of the first raw material activating/supplying section 14. The output of a 2.45 GHz microwave was set to 300 W and the matching of the microwave was made using a tuner to discharge. The output of the reflecting wave at this time was 0 W. In this condition, trimethyl gallium (TMG) which used nitrogen gas as a carrier gas and was kept at 0° C. was introduced from the gas introduction pipe 30 of the first raw material activating/supplying section 14 through a mass flow controller in an intermittent mode in which an operation of the introduction of 1.0 sccm gas for 3 seconds and a successive suspension of operation for 3 seconds were performed in one cycle. While, 1000 sccm of hydrogen was introduced into the quartz pipe 24 from the gas introduction pipe 25 of the second raw material activating/supplying section 51, the output of a 13.56 MHz high-frequency wave was set to 100 W and the matching of the high-frequency wave was made to discharge.

At this time, emission and extinction of a Ga atom in the remote plasma were repeated so as to substantially follow the introduction of TMG. The pressure in the reactor 12 measured at this time by a Baratron vacuum gauge was 27 Pa. The film formation was continued for one hour to measure the composition of the film by XPS. As a consequence the Ga/N ratio was 1.01, almost corresponding to the stoichiometric ratio. Each of the diffraction peaks of an X-ray diffraction spectrum for the films on the Si substrate and sapphire substrate were only the (0002) peak of the hexagonal system, showing that the resulting films were monocrystals. In the infrared spectrum of the film on the Si substrate, no peaks of NH and GaH were found, showing that only small hydrogen was present in the film. A strong and sharp peak of GaN was observed and the width of the absorption peak of GaN was 75 cm$^{-1}$, showing that the resulting film had better crystallinity. The photoluminescence of each of the samples of the films formed on the substrates was measured at room temperature by a 20 mW He—Cd laser to confirm band edge emission at 370 nm.

EXAMPLE 7

Using the semiconductor device-producing apparatus 40 shown in FIG. 2, each of a washed Si substrate with a (100) crystalline plane orientation and a sapphire substrate having a C plane was placed on a substrate holder 20 and was heated to 400° C. by the heater 22 after the reactor 12 was evacuated via the exhaust pipe 18. 1000 sccm of N$_2$ gas was introduced into the quartz pipe 24 with a diameter of 25 mm from the gas introduction pipe 25 of the first raw material activating/supplying section 14. The output of a 2.45 GHz microwave was set to 250 W via the microwave waveguide 28 and the matching of the microwave was made using a tuner to discharge. The output of the reflecting wave at this time was 0 W. While, 200 sccm of H$_2$ gas was introduced into the quartz pipe 24 with a diameter of 30 mm from the gas introduction pipe 25 of the second raw material activating/supplying section 41. The output of the microwave was set to 100 W. The output of the reflecting wave at this time was 0 W. In this condition, trimethyl gallium (TMG) vapor, which used hydrogen gas as a carrier gas and was kept at 0° C., was introduced intermittently from the gas introduction pipe 30 of the first raw material activating/supplying section 14 through a mass flow controller while being bubbled. The vapor was introduced for 5 seconds at an interval of 5 seconds for suspension. The pressure in the reactor 12 measured at this time by a Baratron vacuum gauge was 0.5 Torr. The film formation was continued for 60 minutes to produce a GaN film having a thickness of 0.3 $\mu$m directly on the Si substrate and the sapphire substrate.

Figure 11:
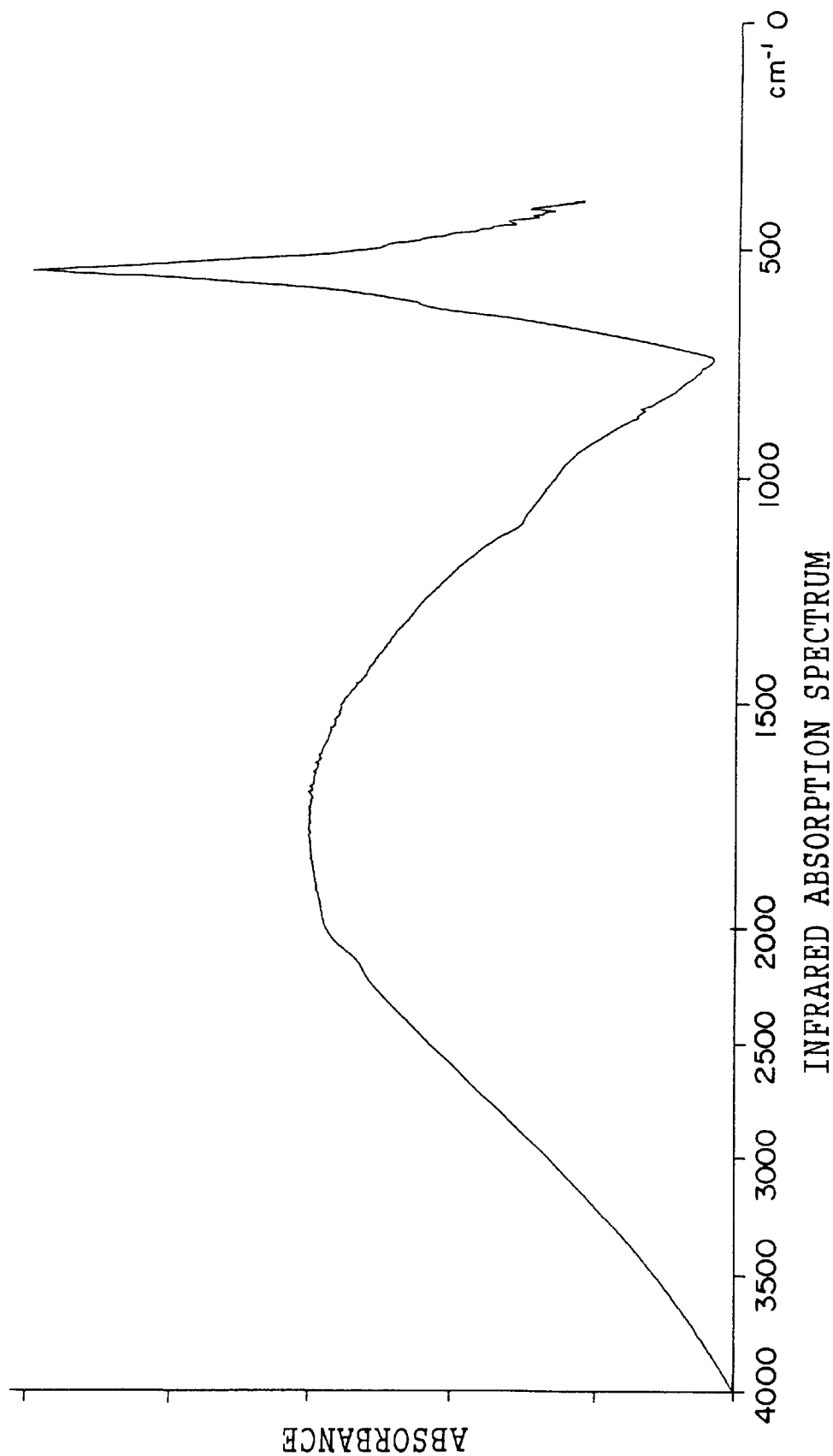
FIG. 11 is a graph showing an infrared absorption spectrum of a film on a Si substrate after the film is formed in example 7.

The composition of the GaN film on the Si substrate was measured by RBS (Rutherford back scattering) to find that the Ga/N ratio was 0.95, almost corresponding to the stoichiometric ratio. The infrared absorption spectrum of the GaN film formed on the Si substrate was measured using an FTIR apparatus. As shown in FIG. 11, a broad absorption was observed in a wide wavelength ranging from 3000 cm$^{-1}$ to 700 cm$^{-1}$ with an absorption peak found in the vicinity of 1700 cm$^{-1}$. A sharp absorption was also observed at a wavelength of about 557 cm$^{-1}$ This sharp absorption was identified as the absorption of a phonon of GaN. The ratio of the intensity of the maximum absorbance (Ia) in the broad absorption to the intensity of the maximum absorbance (Ib) in the vicinity of 557 cm$^{-1}$, specifically, (Ia/Ib), was 0.59. Moreover, the half width of the absorption peak at the wavelength of 557 cm was 90 cm$^{-1}$.

Figure 12:
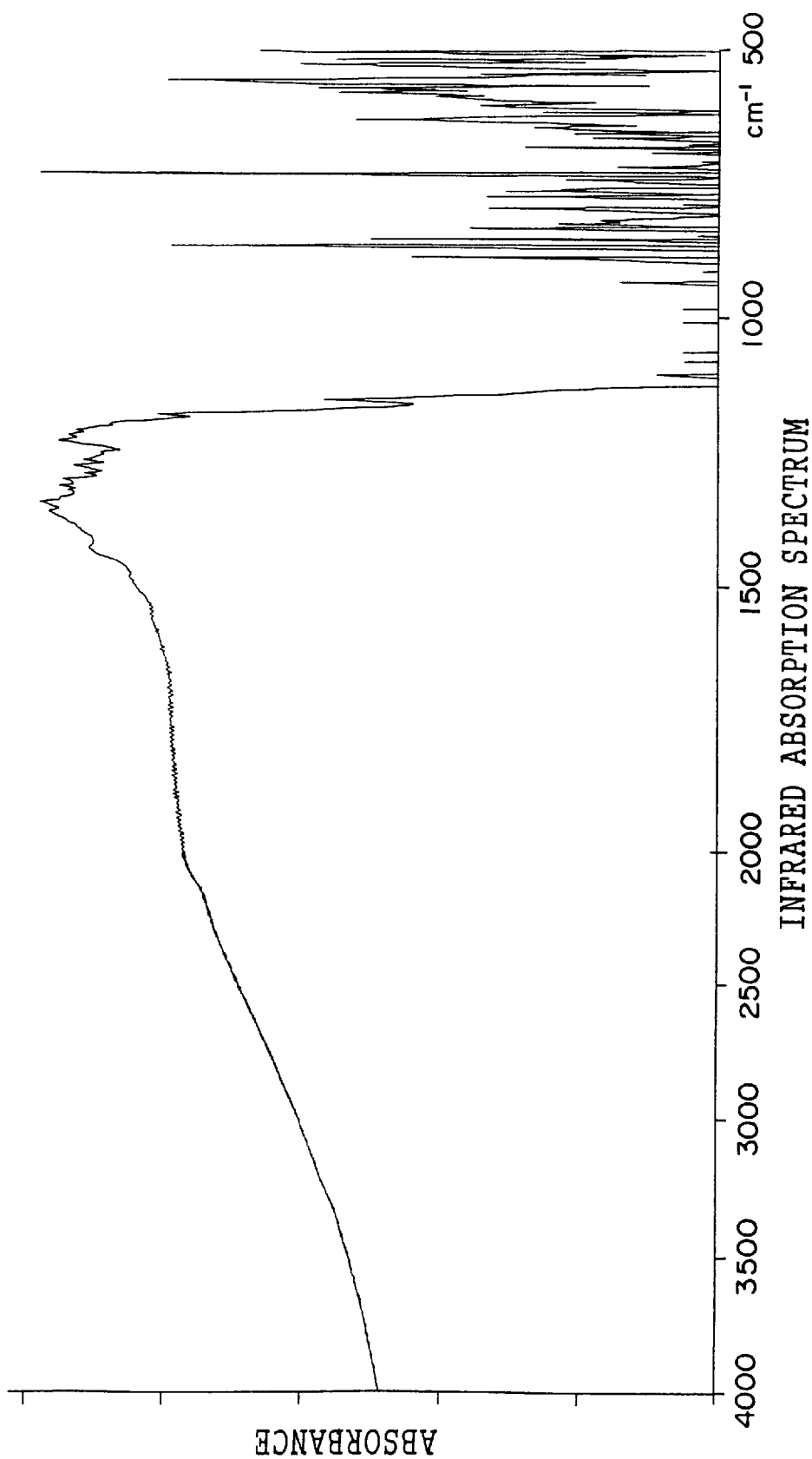
FIG. 12 is a graph showing an infrared absorption spectrum of a film on a sapphire substrate after the film is formed in example 7.

FIG. 12 is a graph showing the infrared spectrum of the GaN film formed at the same time on the sapphire substrate.

The X-ray diffraction pattern of each of the GaN films formed on the Si substrate and the sapphire substrate was measured. It was confirmed that, in both films, a (0001) plane of the hexagonal system was grown.

The dark resistance measured was 10$^{+3}$ Ω·cm. The photoluminescence of each was measured using UV-rays from a 20 mW He—Cd laser at 370 nm. Exciton emission at the band edge was observed.

Comparative Example 3

Figure 13:
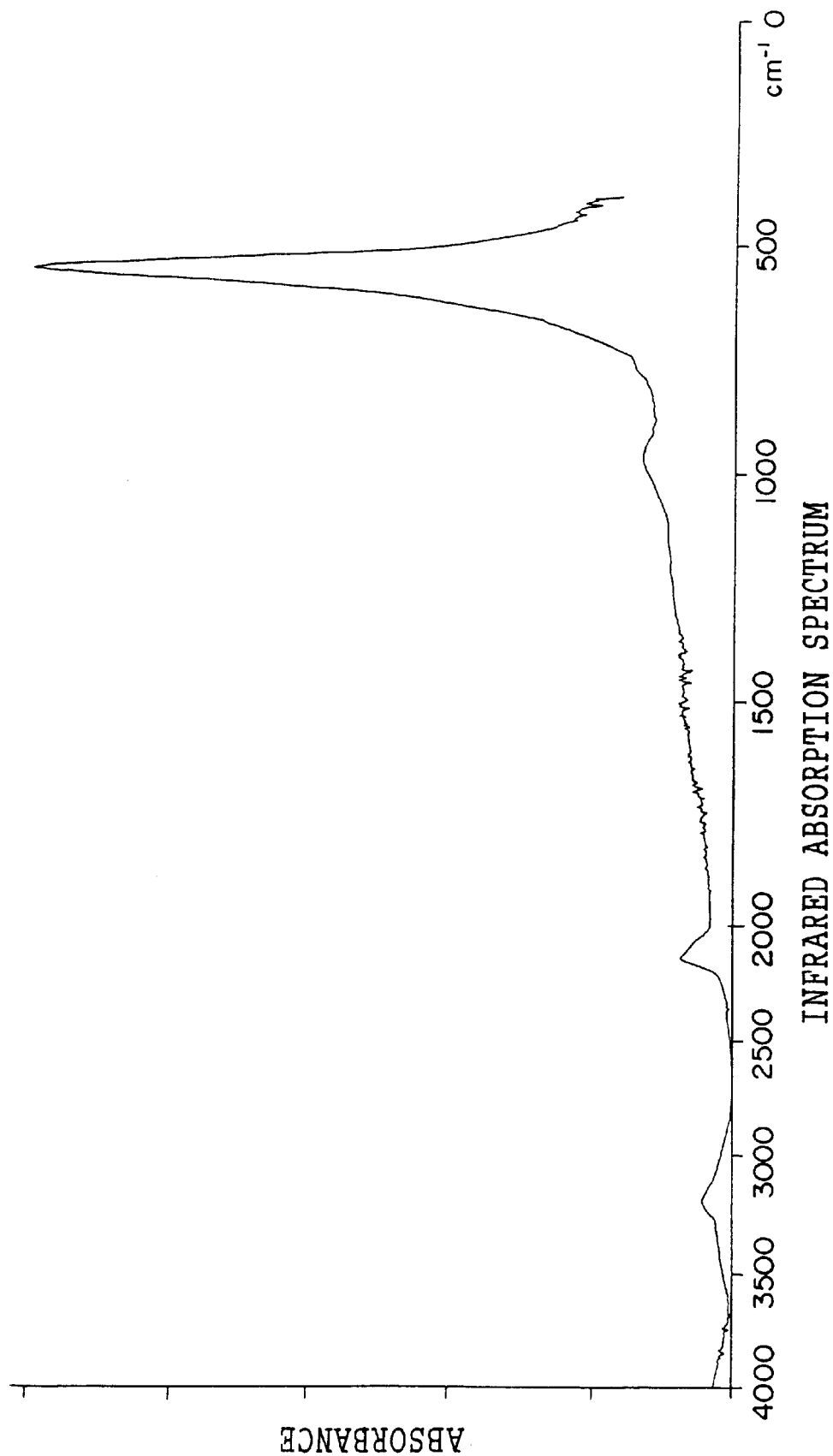
FIG. 13 is a graph showing an infrared absorption spectrum of a film on a Si substrate after the film is formed in Comparative example 3.

A film was formed in the same conditions as in EXAMPLE 7 except that TMG was continuously supplied at an average flow rate of 0.5 sccm. The film formation was continued for 60 minutes to form a GaN film having a thickness of 0.3 $\mu$m. The infrared absorption spectrum of the GaN film formed on the Si substrate was measured. As shown in FIG. 13, the background in a wavelength ranging from 3000 cm$^{-1}$ to 700 cm$^{-1}$ was flat and no broad absorption in a wide wavelength ranging from 3000 cm$^{-1}$ to 700 cm$^{-1}$ was observed unlike in EXAMPLE 7. However, a sharp absorption was observed at a wavelength of about 550 cm$^{-1}$ . Though the half width was similar to that in EXAMPLE 7, the line width was broader than that of FIG. 10 in over half the absorption range, showing that the crystallinity was low. The ratio of the intensity of the maximum absorbance (Ia) in the broad absorption to the intensity of the maximum absorbance (Ib) in the sharp absorption at the vicinity of 550 cm$^{-1}$, specifically, (Ia/Ib), was 0. Moreover, in the GaN film formed on the Si substrate, the absorption peak of N—H was observed in the vicinity of 2900cm$^{-1}$ and the absorption peak of Ga—H was observed in the vicinity of 2105 cm$^{-1}$ and it was hence understood that the film contained hydrogen.

The infrared spectrum of the GaN film formed at the same time on the sapphire substrate was measured. It was confirmed that the absorption peaks of N—H and Ga—H were observed. It was understood that the films formed on the sapphire substrate and the silicon substrate were the same.

The dark resistance measured was 10$^{+12}$ Ω·cm. The photoluminescence of each was measured using UV-rays from a 20 mW He—Cd laser at 325 nm. Slight visible emission was observed but no exciton emission at the band edge was observed. The XRD of each of the films formed on the sapphire substrate and the Si substrate was measured. As a result, other than the peak signal of (0002) plane, for example, the peak signals of the following two- and three-crystalline plane orientations were observed and it was hence confirmed that the resulting film was a polycrystal.

$(10\bar{1}0)$ $(10\bar{1}1)$

EXAMPLE 8

Figure 14:
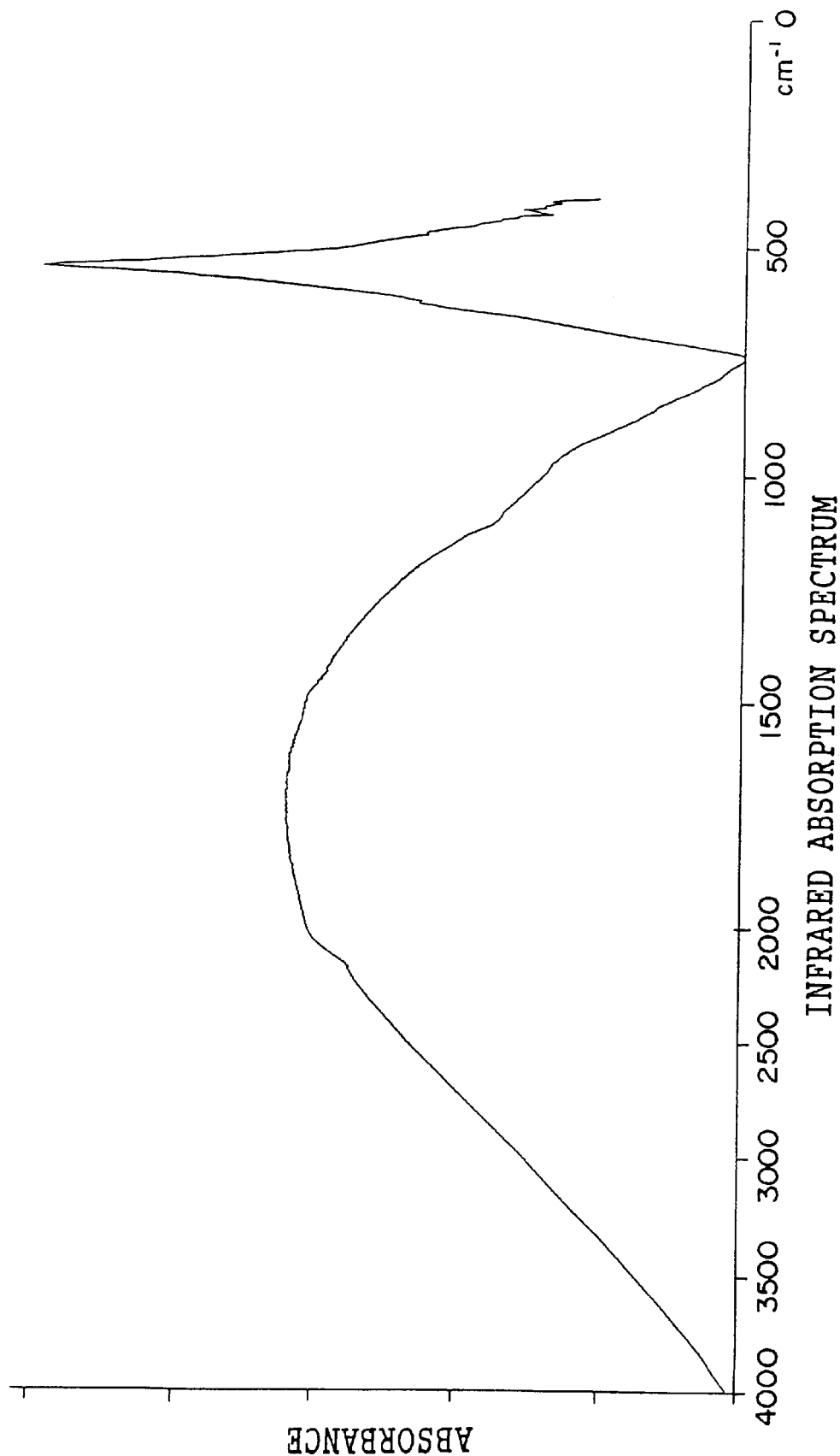
FIG. 14 is a graph showing an infrared absorption spectrum of a film on a Si substrate after the film is formed in example 8.

20 sccm of monosilane diluted to 10 ppm by the addition of hydrogen was introduced from the gas introduction pipe 30 of the second raw material activating/supplying section 41 in the same substrate conditions as in EXAMPLE 7. The film formation was continued for 60 minutes to form a Si-doped GaN:H film having a thickness of 0.3 $\mu$m. The infrared absorption spectrum of the GaN film formed on the Si substrate was measured using an FTIR apparatus. Like in EXAMPLE 7, a broad absorption was observed in a wide wavelength ranging from 3000 cm$^{-1}$ to 750 cm$^{-1}$ with an absorption peak found in the vicinity of 1700 cm$^{-1}$ and a sharp absorption was also observed at a wavelength of about 557 cm$^{-1}$ (FIG. 14). The ratio of the intensity of the maximum absorbance (Ia) in the broad absorption to the intensity of the maximum absorbance (Ib) in the vicinity of 557 cm$^{-1}$, specifically, (Ia/Ib), was 0.50. Moreover, the half width of the absorption peak at the wavelength of 557 cm$^{-1}$ was 85 cm$^{-1}$.

The X-ray diffraction pattern of each of the GaN films formed on the Si substrate and the sapphire substrate was measured. It was confirmed that, in both films, a (0001) plane of the hexagonal system was grown.

The current-voltage properties measured of these films were 10$^{+3}$ Ωcm, showing that these films were both n-types. Moreover, the photoluminescence of each was measured using UV-rays from a 20 mW He—Cd laser at 325 nm. Exciton emission at the band edge was observed.

EXAMPLE 9

In the same condition as in EXAMPLE 7, 5 sccm of trimethyl indium using H$_2$ gas as a carrier gas was further introduced into the reaction system. The substrate temperature was 300° C. The reaction pressure measured at this time by a Baratron vacuum gauge was 0.5 Torr. The film formation was continued for 30 minutes to form an InGaN:H film having a thickness of 0.1 μm. The infrared absorption spectrum of the GaN film formed on the Si substrate was measured using an FTIR apparatus. Other than the absorptions of NH and InGa—H, a broad absorption was observed in a wide wavelength ranging from 3000 cm$^{-1}$ to 700 cm$^{-1}$ with an absorption peak found in the vicinity of 2000 cm$^{-1}$ (FIG. 15). The X-ray diffraction pattern of the InGaN:H film formed on the Si substrate was measured. It was confirmed that a (0001) plane of the hexagonal system was grown. The current-voltage characteristic measured of the film was 10$^{+5}$ Ωcm.

EXAMPLE 10

20 sccm of biscyclopentadienyl diluted to 10 ppm by the addition of hydrogen was introduced from the gas introduction pipe 30 of the second raw material activating/supplying section 41 in the same substrate conditions as in EXAMPLE 7. The substrate temperature was 400° C. The film formation was continued for 60 minutes to form a GaN:H film doped with 2000 ppm of Mg and having a thickness of 0.1 μm. The infrared absorption spectrum of the GaN film formed on the Si substrate was measured using an FTIR apparatus. Like in EXAMPLE 7, a broad absorption was observed in a wide wavelength ranging from 3000 cm$^{-1}$ to 750 cm$^{-1}$ with an absorption peak found in the vicinity of 1700 cm$^{-1}$ and a sharp absorption was also observed at a wavelength of about 557 cm$^{-1}$ (FIG. 16). The ratio of the intensity of the maximum absorbance (Ia) in the broad absorption to the intensity of the maximum absorbance (Ib) in the vicinity of 557 cm$^{-1}$, specifically, (Ia/Ib), was 0.50. Moreover, the half width of the absorption peak at the wavelength of 557 cm$^{-1}$ was 85 cm$^{-1}$. Moreover, the absorptions of N—H and GaH were observed in the vicinities of 2900 cm$^{-1}$ and 2100 cm$^{-1}$ respectively.

FIG. 17 is a graph showing the absorption spectrum of the GaN film formed on the sapphire substrate at the same time.

The X-ray diffraction pattern of each of the GaN films formed on the Si substrate and the sapphire substrate was measured. It was confirmed that, in both films, a (0001) plane of the hexagonal system was grown.

The current-voltage properties measured of these films were 10$^{+8}$ Ωcm, showing that these films were both n-types. Moreover, the photoluminescence of each was measured using UV-rays from a 20 mW He—Cd laser at 325 nm. Exciton emission at the band edge was observed.

EXAMPLE 11

An i-type GaN film with a thickness of 0.1 μm was produced using the same method and conditions as those in EXAMPLE 10 except that p-type Si (100) was used as the substrate. On the i-type GaN film, an n-type GaN film with a thickness of 0.1 μm was formed in the same conditions as those in EXAMPLE 8.

The infrared absorption spectrum of the GaN film formed on the Si substrate was measured using an FTIR apparatus. Like in EXAMPLE 7, a broad absorption was observed in a wide wavelength ranging from 3000 cm$^{-1}$ to 700 cm$^{-1}$ with an absorption peak found in the vicinity of 1700 cm$^{-1}$ and a sharp absorption was also observed at a wavelength of about 555 cm$^{-1}$. The ratio of the intensity of the maximum absorbance (Ia) in the broad absorption to the intensity of the maximum absorbance (Ib) in the vicinity of 555 cm$^{-1}$, specifically, (Ia/Ib), was 0.50. Moreover, the half width of the absorption peak at the wavelength of 555 cm$^{-1}$ was 85 cm$^{-1}$. Moreover, the absorptions of N—H and GaH were observed in the vicinities of 2900 cm$^{-1}$ and 2100 cm$^{-1}$ respectively. It was confirmed from the absorbance that 5% of hydrogen was contained in the film.

The X-ray diffraction pattern of each of the GaN films formed on the Si substrate and the sapphire substrate was measured. It was confirmed that, in both films, a (0001) plane of the hexagonal system was grown and it was confirmed that a rectifying device can be produced.

The current-voltage properties measured of these films showed that these films had a rectification function. Also, the photoelectromotive force was as high as 1.3 V and the semiconductor device can hence be used as a solar cell. Moreover, the dark current measured was as low as 10$^{-11}$ A and the device can hence be used also as an ultra-low noise photosensor.

The present invention can provide a method and apparatus for the production of a semiconductor device, the method producing a high quality and highly functional semiconductor device efficiently at low temperatures in a short time and also provide a semiconductor device produced by the method and apparatus.

What is claimed is:

1. A semiconductor device produced by forming a film of a nitride compound on a substrate having heat resistance at 600° C. or less, the nitride compound including one or more elements selected from group IIIA elements of the periodic table and a nitrogen atom, and the nitride compound film being one of monocrystal and polycrystal film, wherein the absorption wavelength for the nitride compound in an infrared absorption spectrum ranges between 3000 cm$^{-1}$ and 700 cm$^{-1}$, and the infrared absorption spectrum has a gentle peak from about 3000 cm$^{-1}$ to about 1000 cm$^{-1}$.

2. A semiconductor device according to claim 1, wherein the absorption wavelength for said nitride compound in an infrared absorption spectrum further ranges between 700 cm$^{-1}$ and 400 cm$^{-1}$ and the ratio (Ia/Ib) of the maximum absorbance (Ia) in a wavelength range between 3000 cm$^{-1}$ and 700 cm$^{-1}$ to the maximum absorbance (Ib) in a wavelength range between 700 cm$^{-1}$ and 400 cm$^{-1}$ is 0.01 or more.

3. A semiconductor device according to claim 1, wherein said substrate is opaque and the semiconductor device is used as a photovoltaic element.

* * * * *